(12) United States Patent
Yamazaki et al.

(10) Patent No.: US 11,264,511 B2
(45) Date of Patent: Mar. 1, 2022

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Haruyuki Baba, Kanagawa (JP); Shiori Murayama, Saitama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/968,796

(22) PCT Filed: Feb. 19, 2019

(86) PCT No.: PCT/IB2019/051309
§ 371 (c)(1),
(2) Date: Aug. 10, 2020

(87) PCT Pub. No.: WO2019/166914
PCT Pub. Date: Sep. 6, 2019

(65) Prior Publication Data
US 2020/0403101 A1    Dec. 24, 2020

(30) Foreign Application Priority Data

Feb. 28, 2018   (JP) .............................. JP2018-034945

(51) Int. Cl.
*H01L 29/786* (2006.01)
*H01L 27/105* (2006.01)
(Continued)

(52) U.S. Cl.
CPC .... *H01L 29/7869* (2013.01); *H01L 21/02178* (2013.01); *H01L 21/02565* (2013.01);
(Continued)

(58) Field of Classification Search
CPC ................. H01L 29/7869; H01L 29/24; H01L 29/66969; H01L 29/78606;
(Continued)

(56) References Cited

U.S. PATENT DOCUMENTS 9,954,113 B2    4/2018  Shimomura et al.
10,096,718 B2   10/2018 Asami
(Continued)

FOREIGN PATENT DOCUMENTS

CN    107210227 A    9/2017
JP    2016-149548 A  8/2016
(Continued)

OTHER PUBLICATIONS

International Search Report (Application No. PCT/IB2019/051309) dated May 28, 2019.
(Continued)

*Primary Examiner* — Tong-Ho Kim
(74) *Attorney, Agent, or Firm* — Fish & Richardson P.C.

(57) ABSTRACT

A semiconductor device with high on-state current is provided.
The semiconductor device includes a transistor. The transistor includes a first insulator; a first oxide over the first insulator; a second oxide over the first oxide; a third oxide; a first conductor and a second conductor over the second oxide; a second insulator; a third conductor; a fourth insulator over the first conductor and the second conductor; and a third insulator over the fourth insulator. An opening reaching the second oxide is provided in the third insulator and the fourth insulator. The third oxide is positioned to cover an inner wall of the opening. The second insulator is positioned to cover the inner wall of the opening with the third oxide therebetween. The third conductor is positioned to fill the opening with the third oxide and the second (Continued)

insulator therebetween. In the channel length direction of the transistor, an angle formed by a bottom surface of the first insulator and a side surface of the first conductor facing the second conductor is smaller than 90°.

6 Claims, 22 Drawing Sheets

(51) Int. Cl.
*H01L 27/12* (2006.01)
*H01L 29/24* (2006.01)
*H01L 21/02* (2006.01)
*H01L 29/66* (2006.01)

(52) U.S. Cl.
CPC .... *H01L 21/02631* (2013.01); *H01L 27/1052* (2013.01); *H01L 27/124* (2013.01); *H01L 27/1207* (2013.01); *H01L 27/1225* (2013.01); *H01L 27/1255* (2013.01); *H01L 29/24* (2013.01); *H01L 29/66969* (2013.01); *H01L 29/78606* (2013.01); *H01L 29/78648* (2013.01); *H01L 29/78696* (2013.01)

(58) Field of Classification Search
CPC ......... H01L 29/78648; H01L 29/78696; H01L 27/1052; H01L 27/1207; H01L 27/1225; H01L 27/124; H01L 27/1255; H01L 21/02178; H01L 21/02565; H01L 21/02631
USPC .......................................................... 257/43
See application file for complete search history.

(56) References Cited

U.S. PATENT DOCUMENTS

| | | |
|---|---|---|
| 10,186,614 B2 | 1/2019 | Asami |
| 2016/0233340 A1 | 8/2016 | Shimomura et al. |
| 2017/0365720 A1 | 12/2017 | Asami |
| 2018/0019343 A1* | 1/2018 | Asami ................ H01L 21/28 |

FOREIGN PATENT DOCUMENTS

| | | |
|---|---|---|
| JP | 2017-228777 A | 12/2017 |
| KR | 2017-0107997 A | 9/2017 |
| WO | WO-2016/125052 | 8/2016 |

OTHER PUBLICATIONS

Written Opinion (Application No. PCT/IB2019/051309) dated May 28, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31.2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC—IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium On VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

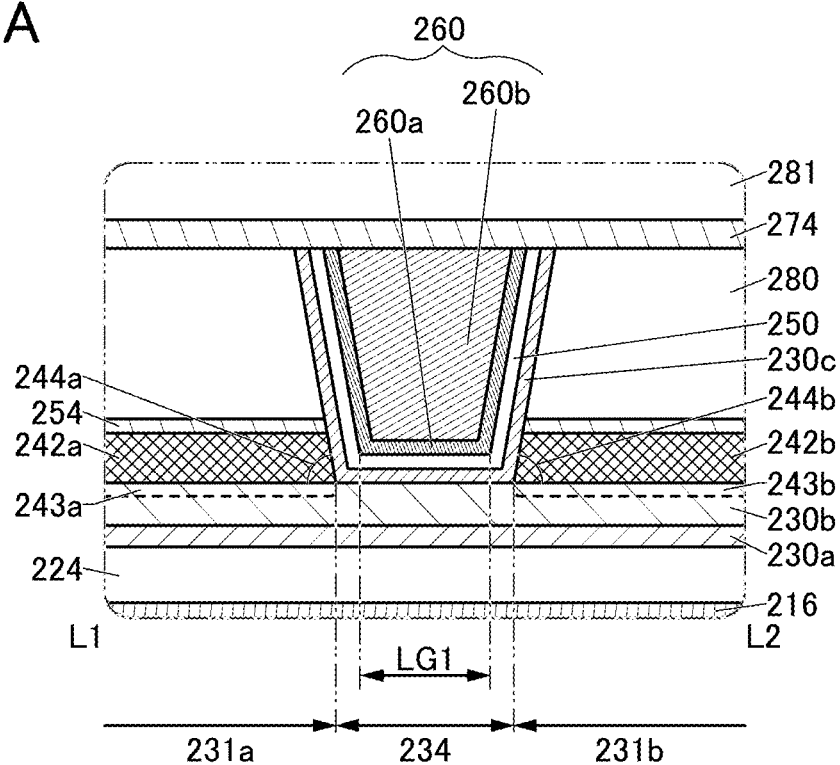
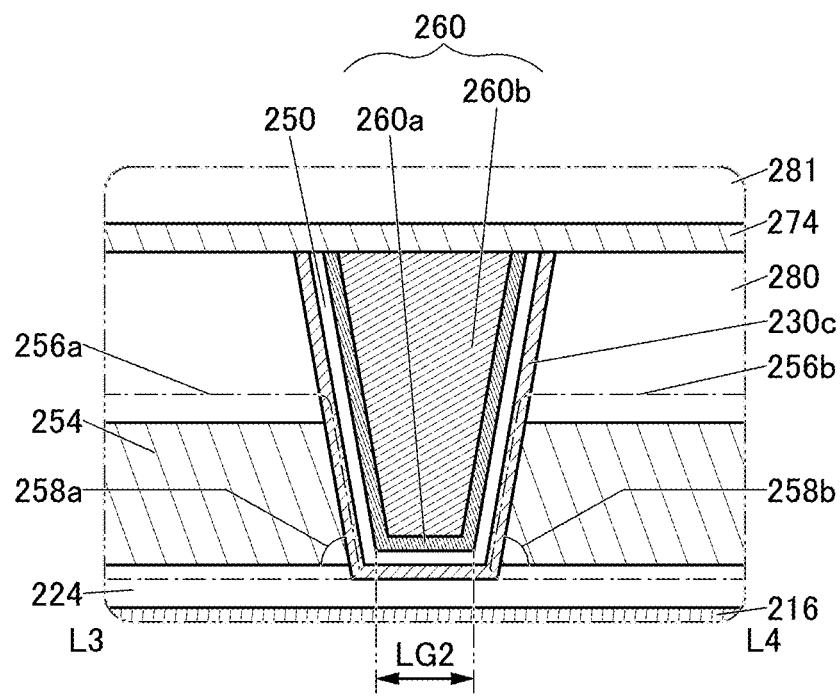

FIG. 20A
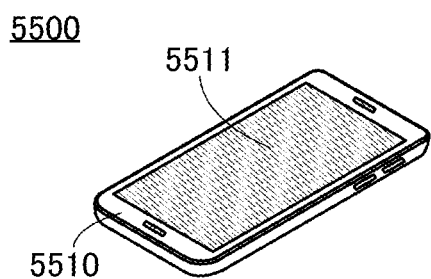
FIG. 20B
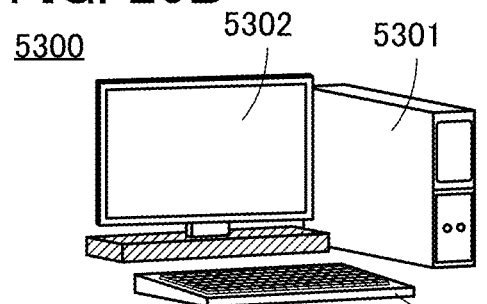
FIG. 20C
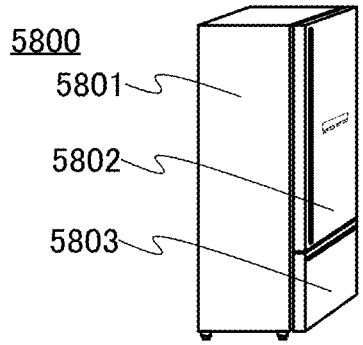
FIG. 20D
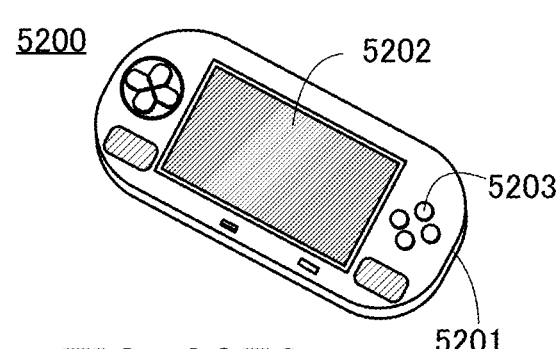
FIG. 20E1
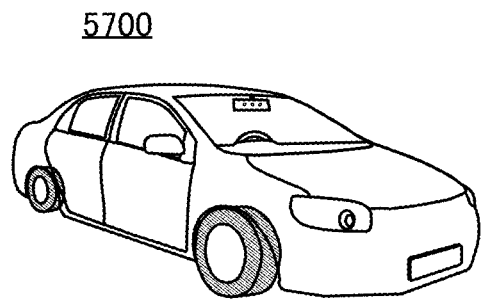
FIG. 20E2
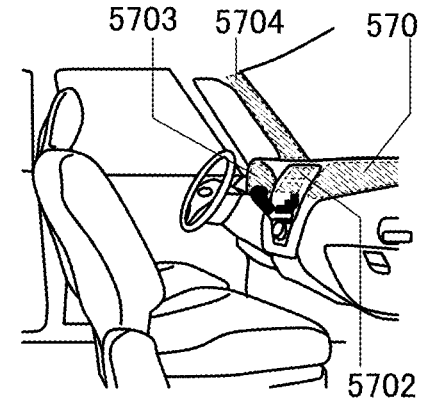
FIG. 20F
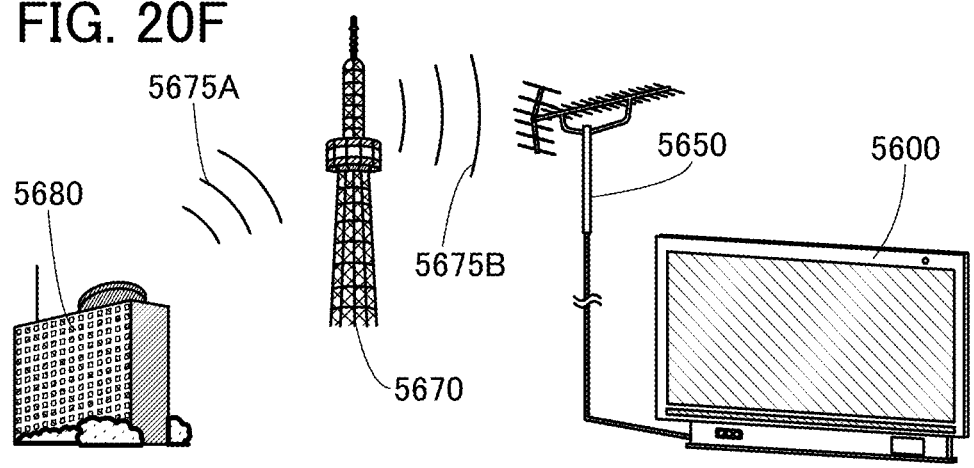

⊢—————⊣ 40nm

SEMICONDUCTOR DEVICE AND METHOD FOR MANUFACTURING SEMICONDUCTOR DEVICE

CROSS REFERENCE TO RELATED APPLICATIONS

This application is a U.S. National Phase Application under 35 U.S.C. § 371 of International Application PCT/IB2019/051309, filed on Feb. 19, 2019, which is incorporated by reference and claims the benefit of a foreign priority application filed in Japan on Feb. 28, 2018, as Application No. 2018-034945.

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A silicon-based semiconductor material is widely known as a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for manufacturing a transistor using an oxide semiconductor having a CAAC structure is also disclosed. Moreover, Non-Patent Document 4 and Non-Patent Document 5 show that a fine crystal is included even in an oxide semiconductor which has lower crystallinity than an oxide semiconductor having the CAAC structure or the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

REFERENCES

Non-Patent Documents

[Non-Patent Document 1] S. Yamazaki et al., "SID Symposium Digest of Technical Papers", 2012, volume 43, issue 1, p. 183-186.

[Non-Patent Document 2] S. Yamazaki et al., "Japanese Journal of Applied Physics", 2014, volume 53, Number 4S, p. 04ED18-1-04ED18-10.

[Non-Patent Document 3] S. Ito et al., "The Proceedings of AM-FPD'13 Digest of Technical Papers", 2013, p. 151-154.

[Non-Patent Document 4] S. Yamazaki et al., "ECS Journal of Solid State Science and Technology", 2014, volume 3, issue 9, p. Q3012-Q3022.

[Non-Patent Document 5] S. Yamazaki, "ECS Transactions", 2014, volume 64, issue 10, p. 155-164.

[Non-Patent Document 6] K. Kato et al., "Japanese Journal of Applied Physics", 2012, volume 51, p. 021201-1-021201-7.

[Non-Patent Document 7] S. Matsuda et al., "2015 Symposium on VLSI Technology Digest of Technical Papers", 2015, p. T216-T217.

[Non-Patent Document 8] S. Amano et al., "SID Symposium Digest of Technical Papers", 2010, volume 41, issue 1, p. 626-629.

SUMMARY OF THE INVENTION

Problems to be Solved by the Invention

An object of one embodiment of the present invention is to provide a semiconductor device having a high on-state current. Alternatively, an object of one embodiment of the present invention is to provide a semiconductor device having excellent frequency characteristics. Alternatively, an object of one embodiment of the present invention is to provide a semiconductor device having favorable reliability. Alternatively, an object of one embodiment of the present invention is to provide a semiconductor device that can be miniaturized or highly integrated. Alternatively, an object of one embodiment of the present invention is to provide a semiconductor device having favorable electrical characteristics. Alternatively, an object of one embodiment of the present invention is to provide a semiconductor device having high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device having high design flexibility. An object of one embodiment of the present invention is to provide a semiconductor device in which power consumption can be reduced. An object of one embodiment of the present invention is to provide a novel semiconductor device.

Note that the descriptions of these objects do not preclude the existence of other objects. Note that one embodiment of the present invention does not necessarily achieve all of these objects. Objects other than these will be apparent from the description of the specification, the drawings, the claims, and the like, and objects other than these can be derived from the description of the specification, the drawings, the claims, and the like.

Means for Solving the Problems

One embodiment of the present invention is a semiconductor device including a transistor. The transistor includes a first insulator, a first oxide over the first insulator, a second oxide over the first oxide, a third oxide over the second oxide, a first conductor and a second conductor over the second oxide, a second insulator over the third oxide, a third conductor over the second insulator, a fourth insulator over the first conductor and the second conductor, and a third insulator over the fourth insulator. An opening reaching the second oxide is provided in the third insulator and the fourth insulator. The third oxide is positioned to cover an inner wall of the opening. The second insulator is positioned to cover the inner wall of the opening with the third oxide therebetween. The third conductor is positioned to fill the opening with the third oxide and the second insulator therebetween. In the channel length direction of the transistor, a first angle formed by a plane parallel to a bottom surface of the first insulator and a side surface of the first conductor, which faces the second conductor, is smaller than 90°.

In the semiconductor device, the fourth insulator includes a region in contact with a side surface of the first conductor, a side surface of the second oxide, and a side surface of the first oxide. In the channel length direction of the transistor, a second angle formed by the plane parallel to the bottom surface of the first insulator and a plane parallel to a side end portion of the fourth insulator in the region, which faces the second conductor, is preferably smaller than 90°.

In the semiconductor device, the first angle and the second angle are preferably the same angle.

One embodiment of the present invention is a semiconductor device including a transistor. The transistor includes a first insulator, a first oxide over the first insulator, a second oxide over the first oxide, a third oxide over the second oxide, a first conductor and a second conductor over the second oxide, a second insulator over the third oxide, a third conductor over the second insulator, a fourth insulator over the first conductor and the second conductor, and a third insulator over the fourth insulator. An opening reaching the second oxide is provided in the third insulator and the fourth insulator. The third oxide is positioned to cover an inner wall of the opening. The second insulator is positioned to cover the inner wall of the opening with the third oxide therebetween. The third conductor is positioned to fill the opening with the third oxide and the second insulator therebetween. In the channel width direction of the transistor, on the basis of a bottom surface of the first insulator, a level of a bottom surface of the third conductor in a region not overlapping with the second oxide is lower than a level of a bottom surface of the second oxide. In the channel length direction of the transistor, a length of the bottom surface of the third conductor in the region not overlapping with the second oxide is shorter than a length of the bottom surface of the third conductor in a region overlapping with the second oxide.

One embodiment of the present invention is a semiconductor device including a transistor. The transistor includes a first insulator, a first oxide over the first insulator, a second oxide over the first oxide, a third oxide over the second oxide, a first conductor and a second conductor over the second oxide, a second insulator over the third oxide, a third conductor over the second insulator, a fourth insulator over the first conductor and the second conductor, and a third insulator over the fourth insulator. An opening reaching the second oxide is provided in the third insulator and the fourth insulator. The third oxide is positioned to cover an inner wall of the opening. The second insulator is positioned to cover the inner wall of the opening with the third oxide therebetween. The third conductor is positioned to fill the opening with the third oxide and the second insulator therebetween. When the transistor is seen from the above, a side end portion of the fourth insulator has a curved shape.

In the semiconductor device, the fourth insulator preferably includes an oxide of aluminum.

Furthermore, in the semiconductor device, the second oxide preferably includes In, an element M (M is Al, Ga, Y, or Sn), and Zn.

Effect of the Invention

According to one embodiment of the present invention, a semiconductor device having a high on-state current can be provided. Alternatively, according to one embodiment of the present invention, a semiconductor device having excellent frequency characteristics can be provided. Alternatively, according to one embodiment of the present invention, a semiconductor device having favorable reliability can be provided. Alternatively, according to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device having high productivity can be provided.

Alternatively, a semiconductor device capable of retaining data for a long time can be provided. Alternatively, a semiconductor device capable of high-speed data writing can be provided. Alternatively, a semiconductor device with high design flexibility can be provided. Alternatively, a semiconductor device in which power consumption can be reduced can be provided. Alternatively, a novel semiconductor device can be provided.

Note that the descriptions of these effects do not preclude the existence of other effects. Note that one embodiment of the present invention does not necessarily have all of these effects. Effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIG. 2 (A), (B) Cross-sectional views of a semiconductor device of one embodiment of the present invention.

FIG. 20 (A), (B), (C), (D), (E1), (E2), (F) Diagrams illustrating electronic devices of embodiments of the present invention.

MODE FOR CARRYING OUT THE INVENTION

Figure 1A:
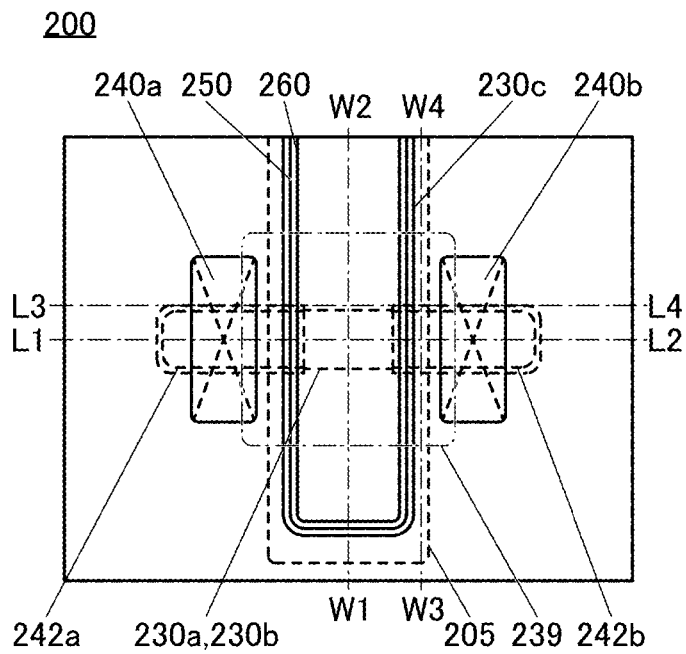
FIG. 1 (A), (B), (C), (D), (E) A top view and cross-sectional views of a semiconductor device of one embodiment of the present invention.

Hereinafter, embodiments will be described with reference to drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the scale. Note that the drawings are schematic views showing ideal examples, and embodiments of the present invention are not limited to shapes, values, or the like shown in the drawings. For example, in the actual manufacturing process, a layer, a resist mask, or the like might be unintentionally reduced in size by treatment such as etching, which is not reflected in the drawings in some cases for easy understanding. Note that in drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like might be omitted.

Note that in this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In this specification and the like, terms for describing arrangement, such as "over" and "under", are used for convenience in describing a positional relationship between components with reference to drawings. Furthermore, the positional relationship between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is disclosed in the drawings or the texts.

Here, X and Y denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter, also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Functions of a source and a drain might be switched when a transistor of opposite polarity is employed or a direction of current is changed in circuit operation. Therefore, the terms "source" and "drain" can be interchanged with each other in this specification and the like in some cases.

Note that the channel length refers to, for example, the distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions are not necessarily the same. In other words, the channel length of one transistor is not fixed to one value in some cases. Thus, in this specification, the channel length is any one of the values, the maximum value, the minimum value, or the average value in a channel formation region.

The channel width refers to, for example, the length in a direction perpendicular to a channel length direction in a region where a semiconductor (or a portion where current flows in a semiconductor when a transistor is in an on state) and a gate electrode overlap with each other, or a channel formation region in a top view of the transistor. In one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that an impurity in a semiconductor refers to, for example, elements other than the main components of the semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed by the mixing of impurities, for example. Furthermore, when the semiconductor is silicon, examples of an impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

In this specification and the like, "parallel" indicates a state where two straight lines are placed such that the angle formed therebetween is greater than or equal to −10° and less than or equal to 10°. Thus, the case where the angle is greater than or equal to −5° and less than or equal to 5° is also included. Furthermore, "substantially parallel" indicates a state where two straight lines are placed such that the angle formed therebetween is greater than or equal to −30° and less than or equal to 30°. Moreover, "perpendicular" indicates a state where two straight lines are placed such that the angle formed therebetween is greater than or equal to 80° and less than or equal to 100°. Thus, the case where the angle is greater than or equal to 85° and less than or equal to 95° is also included. In addition, "substantially perpendicular" indicates a state where two straight lines are placed such that the angle formed therebetween is greater than or equal to 60° and less than or equal to 120°.

Note that in this specification, a barrier film means a film having a function of inhibiting the passage of oxygen and impurities such as water and hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where an OS transistor is stated, it can also be referred to as a transistor including an oxide or an oxide semiconductor.

In this specification and the like, "normally off" means that current per micrometer of channel width flowing through a transistor when no potential is applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

Embodiment 1

An example of a semiconductor device including a transistor 200 of one embodiment of the present invention is described below.

<Structure Example of Semiconductor Device>

FIG. 1(A) to FIG. 1(E) are a top view and cross-sectional views of the transistor 200 of one embodiment of the present invention and the periphery of the transistor 200.

Figure 1D:
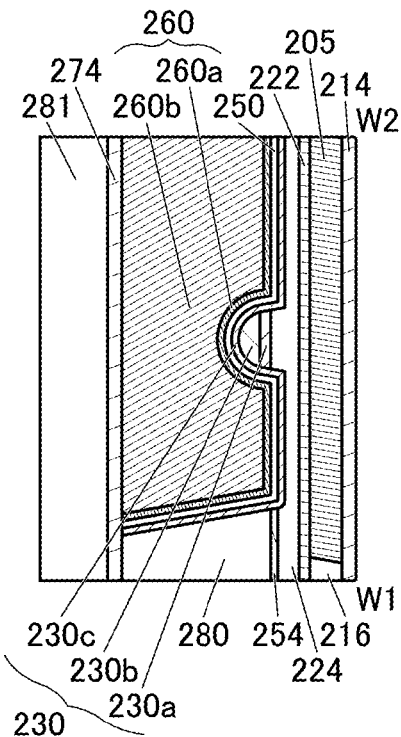
Figure 1B:
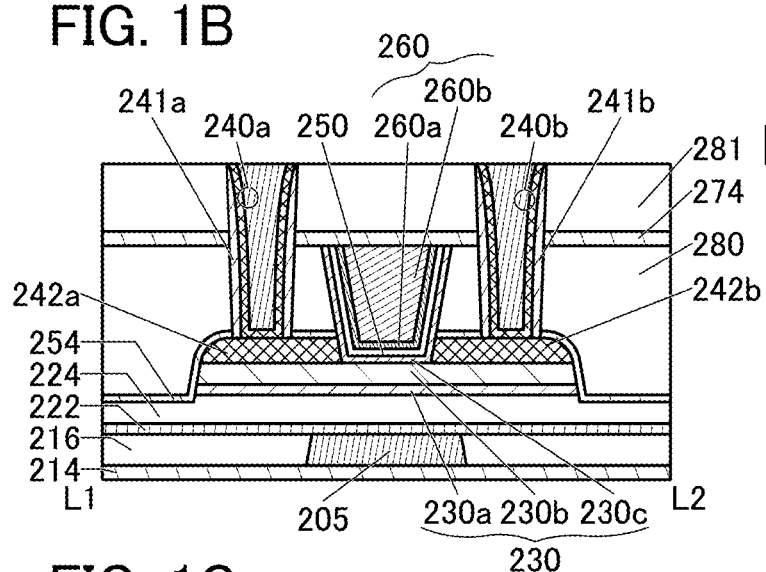
Figure 1E:
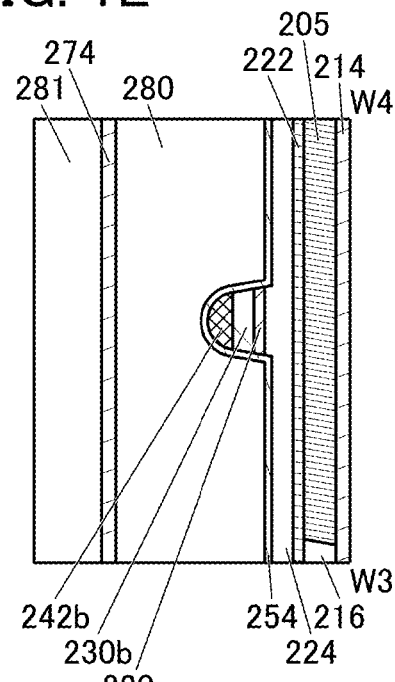
Figure 1C:
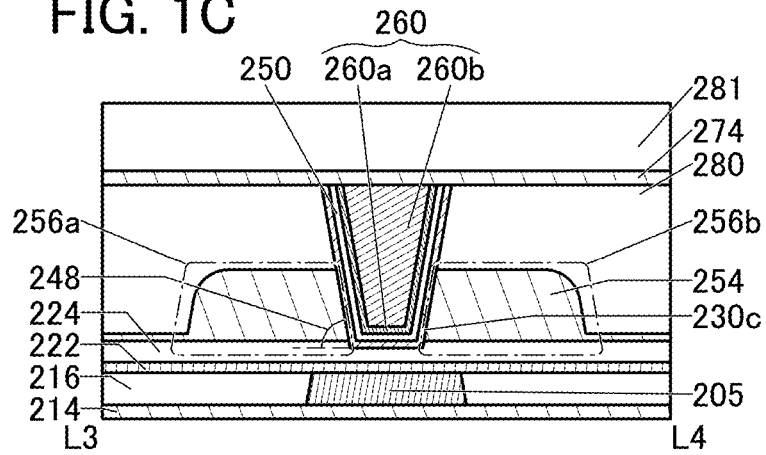

FIG. 1(A) is a top view of a semiconductor device including the transistor 200. In addition, FIG. 1(B) to FIG. 1(E) are cross-sectional views of the semiconductor device. Here, FIG. 1(B) is a cross-sectional view of a portion indicated by dashed-dotted line L1-L2 in FIG. 1(A), and is also a cross-sectional view in the channel length direction of the transistor 200. In addition, FIG. 1(C) is a cross-sectional view of a portion indicated by dashed-dotted line L3-L4 in FIG. 1(A), and is also a cross-sectional view in the channel length direction of the transistor 200. FIG. 1(D) is a cross-sectional view of a portion indicated by dashed-dotted line W1-W2 in FIG. 1(A), and is also a cross-sectional view in the channel width direction of the transistor 200. In addition, FIG. 1(E) is a cross-sectional view of a portion indicated by dashed-dotted line W3-W4 in FIG. 1(A), and is also a cross-sectional view in the channel width direction of the transistor 200. Note that for clarification of the drawing, some components are omitted in the top view in FIG. 1(A). A conductor 240 and an insulator 241 are omitted in FIG. 1(C).

The semiconductor device of one embodiment of the present invention includes the transistor 200, and an insulator 214, an insulator 280, an insulator 274, and an insulator 281 that function as interlayer films. The semiconductor device also includes a conductor 240 (a conductor 240a and a conductor 240b) which is electrically connected to the transistor 200 and functions as a plug. Note that an insulator 241 (an insulator 241a and an insulator 241b) is provided in contact with a side surface of the conductor 240 functioning as a plug.

In contact with a side wall of an opening in an insulator 254, the insulator 280, the insulator 274, and the insulator 281, the insulator 241 is provided. In contact with its side surface, a first conductor of the conductor 240 is provided, and a second conductor of the conductor 240 is further provided on the inner side. Here, a top surface of the conductor 240 and a top surface of the insulator 281 can be substantially level with each other. Although the transistor 200 having a structure in which the first conductor of the conductor 240 and the second conductor of the conductor 240 are stacked is illustrated, the present invention is not limited thereto. The conductor 240 may be provided to have a single-layer structure or a stacked-layer structure of three or more layers, for example. In the case where a structure body has a stacked-layer structure, the layers may be distinguished by ordinal numbers given according to the formation order.

[Transistor 200]

As illustrated in FIG. 1, the transistor 200 includes an insulator 216 positioned over a substrate (not illustrated); a conductor 205 positioned to be embedded in the insulator 216; an insulator 222 positioned over the insulator 216 and the conductor 205; an insulator 224 positioned over the insulator 222; an oxide 230 (an oxide 230a, an oxide 230b, and an oxide 230c) positioned over the insulator 224; an insulator 250 positioned over the oxide 230; a conductor 260 (a conductor 260a and a conductor 260b) positioned over the insulator 250; a conductor 242a and a conductor 242b in contact with part of a top surface of the oxide 230b; and the insulator 254 positioned in contact with part of a top surface of the insulator 224, a side surface of the oxide 230a, a side surface of the oxide 230b, a side surface of the conductor 242a, a top surface of the conductor 242a, a side surface of the conductor 242b, and a top surface of the conductor 242b.

Here, the conductor 260 functions as a gate electrode of the transistor and the conductor 242a and the conductor 242b function as a source electrode and a drain electrode. In the transistor 200, the conductor 260 functioning as the gate electrode is formed in a self-aligned manner to fill an opening formed in the insulator 280 and the like. The formation of the conductor 260 in this manner allows the conductor 260 to be surely placed in a region between the conductor 242a and the conductor 242b without alignment.

Note that the conductor 260 preferably includes the conductor 260a and the conductor 260b positioned over the conductor 260a. For example, in the conductor 260, the conductor 260a is preferably positioned so as to cover a bottom surface and side surfaces of the conductor 260b. In addition, as illustrated in FIG. 1(B), a top surface of the conductor 260 is substantially aligned with a top surface of the insulator 250 and a top surface of the oxide 230c. Although in the transistor 200, the conductor 260 has a two-layer stacked structure, the present invention is not limited thereto. For example, the conductor 260 may have a single-layer structure or a stacked-layer structure of three or more layers.

The insulator 222, the insulator 254, and the insulator 274 each preferably have a function of inhibiting diffusion of hydrogen (e.g., at least one of a hydrogen atom, a hydrogen molecule, and the like). In addition, the insulator 222, the insulator 254, and the insulator 274 each preferably have a function of inhibiting diffusion of oxygen (e.g., at least one of an oxygen atom, an oxygen molecule, and the like). For example, the insulator 222, the insulator 254, and the insulator 274 each preferably have lower permeability of one or both of hydrogen and oxygen than the insulator 224. The insulator 222, the insulator 254, and the insulator 274 each preferably have lower permeability of one or both of hydrogen and oxygen than the insulator 250. The insulator 222, the insulator 254, and the insulator 274 each preferably have lower permeability of one or both of hydrogen and oxygen than the insulator 280.

As illustrated in FIG. 1(B), the insulator 254 is preferably in contact with the top surfaces of the conductor 242a and the conductor 242b, the side surfaces of the conductor 242a and the conductor 242b except facing side surfaces of the conductor 242a and the conductor 242b, the side surfaces of the oxide 230a and the oxide 230b, and the part of the top surface of the insulator 224. Thus, the insulator 280 is isolated from the insulator 224, the oxide 230a, and the oxide 230b by the insulator 254. Accordingly, entry of impurities such as hydrogen contained in the insulator 280 or the like into the insulator 224, the oxide 230a, and the oxide 230b can be inhibited.

The oxide 230 preferably includes the oxide 230a positioned over the insulator 224, the oxide 230b positioned over the oxide 230a, and the oxide 230c which is positioned over the oxide 230b and at least partly in contact with the top surface of the oxide 230b.

Note that the transistor 200 has a structure in which three layers of the oxide 230a, the oxide 230b, and the oxide 230c are stacked in a channel formation region and its vicinity; however, the present invention is not limited thereto. For example, a single layer of the oxide 230b, a two-layer structure of the oxide 230a and the oxide 230b, a two-layer structure of the oxide 230b and the oxide 230c, or a stacked-layer structure of four or more layers may be provided.

In the transistor 200, for the oxide 230 (the oxide 230a, the oxide 230b, and the oxide 230c), which includes the channel formation region, a metal oxide functioning as a semiconductor (hereinafter also referred to as an oxide semiconductor) is preferably used.

The transistor 200 using an oxide semiconductor in the channel formation region has an extremely low leakage current (off-state current) in a non-conduction state; thus, a semiconductor device with low power consumption can be provided. An oxide semiconductor can be deposited by a sputtering method or the like, and thus can be used for the transistor 200 included in a highly integrated semiconductor device.

For example, for the oxide 230, a metal oxide such as an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum (Al), gallium (Ga), yttrium (Y), or tin (Sn) is preferably used for the element M Furthermore, for the oxide 230, an In—Ga oxide or an In—Zn oxide may be used.

A transistor using an oxide semiconductor is likely to have its electrical characteristics changed by impurities and oxygen vacancies in a channel formation region of the oxide semiconductor, in which case the reliability might be reduced. Moreover, when the channel formation region of the oxide semiconductor includes oxygen vacancies, the transistor is likely to have normally-on characteristics. Thus, it is preferable that oxygen vacancies in the channel formation region be reduced as much as possible. For example, oxygen is preferably supplied to the oxide 230 through the insulator 250 or the like to fill the oxygen vacancies. Thus, a transistor that has stable electrical characteristics with a small variation in electrical characteristics and improved reliability can be provided.

In the case where an element included in the conductor 242 (the conductor 242a and the conductor 242b) functioning as a source electrode and a drain electrode and being provided over and in contact with the oxide 230 has a function of absorbing oxygen in the oxide 230, a low-resistance region is formed in part of a region between the oxide 230 and the conductor 242 or in the vicinity of the surface of the oxide 230, in some cases. In that case, in the low-resistance region, an impurity (hydrogen, nitrogen, a metal element, or the like) entering oxygen vacancies serves as a donor, and the carrier density increases in some cases. Note that in the following description, a defect formed by entry of hydrogen into an oxygen vacancy is referred to as VoH in some cases.

FIG. 2(A) shows an enlarged view of a region of part of the transistor 200 illustrated in FIG. 1(B). As illustrated in FIG. 2(A), the conductor 242 is provided over and in contact with the oxide 230b, and a region 243 (a region 243a and a region 243b) is formed as a low-resistance region at and near the interface of the oxide 230b with the conductor 242 in some cases. The oxide 230 includes a region 234 functioning as the channel formation region of the transistor 200 and a region 231 (a region 231a and a region 231b) including at least part of the region 243 and functioning as a source region or a drain region. Note that in the following drawings, even when the region 243 is not illustrated in an enlarged view or the like, the same region 243 has been formed in some cases.

Note that although an example in which the region 243a and the region 243b are provided to spread in the depth direction of the oxide 230b near the conductor 242 is illustrated, the present invention is not limited thereto. The region 243a and the region 243b may be formed as appropriate in accordance with the required electrical characteristics of the transistor. In the oxide 230, the boundaries between the regions are difficult to detect clearly in some cases. The concentration of an element detected in each region may not only gradually change between the regions, but also continuously change (also referred to as a gradation) within each region.

The insulator 274 is in contact with each of the top surfaces of the conductor 260, the oxide 230c, and the insulator 250. The transistor 200 which is one embodiment of the present invention has a structure in which the insulator 274 and the insulator 250 are in contact with each other as illustrated in FIG. 2(A). Such a structure can inhibit impurities (hydrogen or the like) contained in the insulator 281 or the like from entering the insulator 250. Thus, adverse effects on the electrical characteristics of the transistor and the reliability of the transistor can be suppressed.

As illustrated in FIG. 2(A), with a bottom surface of the insulator 224 as a reference, the level of the bottom surface of the conductor 260 in a region overlapping with the region 234 is lower than the level of the top surface of each of the conductor 242a and the conductor 242b in some cases. For example, the difference between the level of the bottom surface of the conductor 260 in the region overlapping with the region 234 and the level of the top surface of each of the conductor 242a and the conductor 242b is greater than or equal to 0 nm and less than or equal to 30 nm, or greater than or equal to 0 nm and less than or equal to 15 nm.

As illustrated in FIG. 1(D), in the channel width direction of the transistor 200, with the bottom surface of the insulator 224 as a reference, the level of the bottom surface of the conductor 260 in a region where the conductor 260 does not overlap with the oxide 230a and the oxide 230b is preferably lower than the level of the bottom surface of the oxide 230b. The conductor 260 functioning as the gate electrode covers the side surface and the top surface of the oxide 230b in the channel formation region with the oxide 230c and the insulator 250 therebetween, whereby an electric field of the conductor 260 easily affects the entire region 234 of oxide 230b. Thus, the on-state current of the transistor 200 can be increased and the frequency characteristics can be improved. The difference between the level of the bottom surface of the conductor 260 in the region where the conductor 260 does not overlap with the oxide 230a and the oxide 230b and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

Here, an angle formed by a plane parallel to the bottom surface of the insulator 224 and the side surface of the conductor 242a, which faces the conductor 242b, is referred to as an angle 244a. Note that when the bottom surface of the insulator 224 and the bottom surface of the conductor 242a are parallel to each other, the angle 244a may be regarded as an angle formed by the bottom surface of the conductor 242a and the side surface of the conductor 242a, which faces the conductor 242b, as shown in FIG. 2(A). An angle formed by a plane parallel to the bottom surface of the insulator 224 and the side surface of the conductor 242b, which faces the conductor 242a, is referred to as an angle 244b. Note that when the bottom surface of the insulator 224 and the bottom surface of the conductor 242b are parallel to each other, the angle 244b may be regarded as an angle formed by the bottom surface of the conductor 242b and the side surface of the conductor 242b, which faces the conductor 242a, as shown in FIG. 2(A). At this time, the angle 244a and the angle 244b are each preferably smaller than 90°. With such a structure, a region in the region 231, which does not overlap with the conductor 260, i.e., an offset region, has a narrow width in the channel length direction of the transistor 200 as compared with that in the case where the angle 244 (the angle 244a and the angle 244b) is 90°; thus, the transistor 200 can have an increased on-state current and improved frequency characteristics. Furthermore, the facing side surfaces of the conductor 242a and the conductor 242b can have increased coverage with the oxide 230c, the insulator 250, and the conductor 260 to be formed in a later step. Note that the angle 244a or the angle 244b are set as appropriate in accordance with required transistor characteristics. A change in the on-state current of the transistor 200 and a change in the operation frequency of the semiconductor device including the transistor 200 when the angle 244 is changed will be described later.

FIG. 2(B) shows an enlarged view of a region of part of the transistor 200 illustrated in FIG. 1(C). Note that the conductor 240 and the insulator 241 are omitted in FIG. 2(B). Here, as illustrated in FIG. 2(B), a region of the insulator 254, which is in contact with the side surface of the conductor 242a, the side surface of the oxide 230b, and the side surface of the oxide 230a, is referred to as a region 256a. In addition, a region of the insulator 254, which is in contact with the side surface of the conductor 242b, the side surface of the oxide 230b, and the side surface of the oxide 230a, is referred to as a region 256b. In the channel length direction of the transistor 200, an angle formed by a plane parallel to the bottom surface of the insulator 224 and a plane parallel to a side end portion of the insulator 254 in the region 256a, which faces the conductor 242b, is referred to as an angle 258a. Note that as illustrated in FIG. 2(B), the angle 258a may be regarded as an angle formed by the bottom surface of the insulator 254 in the region 256a and the plane parallel to the side end portion of the insulator 254 in the region 256a, which faces the conductor 242b, when the bottom surface of the insulator 224 and the bottom surface of the insulator 254 in the region 256a are parallel to each other. An angle formed by a plane parallel to the bottom surface of the insulator 224 and a plane parallel to a side end portion of the insulator 254 in the region 256b, which faces the conductor 242a, is referred to as an angle 258b. Note that as illustrated in FIG. 2(B), the angle 258b may be regarded as an angle formed by the bottom surface of the insulator 254 in the region 256b and the plane parallel to the side end portion of the insulator 254 in the region 256b, which faces the conductor 242a, when the bottom surface of the insulator 224 and the bottom surface of the insulator 254 in the region 256b are parallel to each other.

At this time, the angle 258a and the angle 258b are each preferably smaller than 90°. When the oxide 230 is in contact with the insulator 254, a low-resistance region is formed in some cases. Accordingly, with such a structure, the resistance of regions in which the region 256a and the region 256b of the insulator 254 and the region 234 of the oxide 230b are in contact with each other can be reduced. Thus, the channel length of the transistor 200 can be controlled. Note that an insulator that forms a low-resistance region in the oxide 230 is aluminum oxide, for example. The angle 258a or the angle 258b can be set as appropriate in accordance with required transistor characteristics. The angle 244a or the angle 244b may be the same as or different from the angle 258a or the angle 258b.

The shapes of the facing side end portions of the insulator 254 in the region 256a and the region 256b are evaluated by an EDX map obtained by energy dispersive X-ray spectroscopy (EDX), for example. For example, when an insulator containing an oxide of aluminum is used for the insulator 254, the shapes can be evaluated by obtaining a cross-sectional EDX map of an Al—K line.

The opening reaching the oxide 230b (the opening exposing the oxide 230b), which is formed in the insulator 280 and the like, preferably has a tapered shape. Here, as illustrated in FIG. 1(C), in the channel length direction of the transistor 200, an angle formed by a side wall of the opening formed in the insulator 280 and the like and a plane obtained by extending, to the outside of the opening, the bottom surface of the opening in a region not overlapping with the oxide 230a and the oxide 230b is an angle 248. At this time, it is preferable that the angle 248 be substantially the same as the angle 244 or the angle 258, for example. With such a structure, the angle 244 or the angle 258 can be easily processed to be smaller than 90°. The coverage with the oxide 230c, the insulator 250, and the conductor 260 positioned on an inner wall of the opening can be increased.

Note that the conductor 260 is provided so as to fill the tapered opening with the oxide 230c and the insulator 250 therebetween, whereby a length LG2 shown in FIG. 2(B) can be shorter than a length LG1 shown in FIG. 2(A). Here, the length LG1 is the length of the bottom surface of the conductor 260 in a region overlapping with the region 234 in the channel length direction of the transistor 200. The length LG2 is the length of the bottom surface of the conductor 260 in the region not overlapping with the oxide 230a and the oxide 230b in the channel length direction of the transistor 200.

Figure 3:
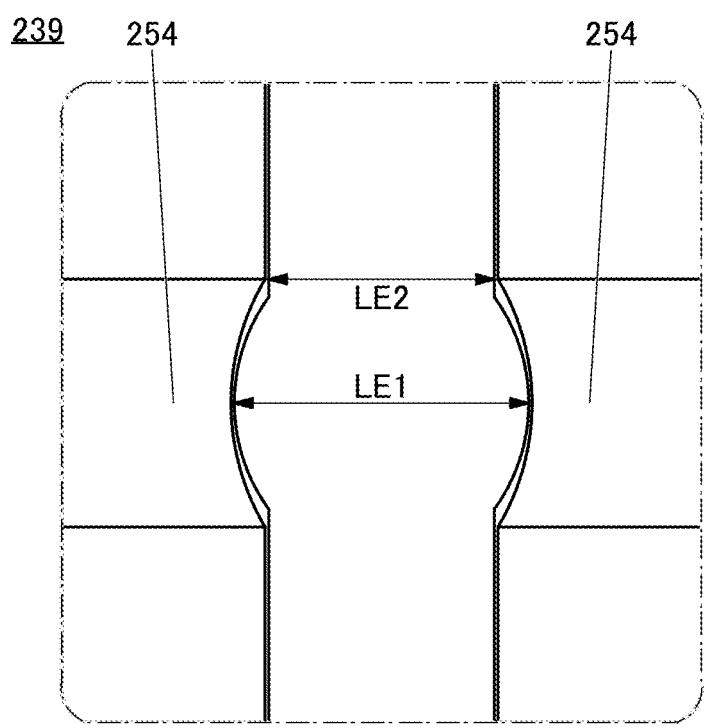
FIG. 3 A schematic top view of a transistor of one embodiment of the present invention.

FIG. 3 shows an enlarged view of a region 239 of the transistor 200 in FIG. 1(A). Note that the region 239 is a region including the side end portion of the insulator 254, which is positioned in the vicinity of the opening formed in the insulator 280 and the like. Note that FIG. 3 is a schematic top view illustrating the insulator 254 and not illustrating the other components. Here, as illustrated in FIG. 3, in a region where the insulator 254 does not overlap with the oxide 230a and the oxide 230b, the shortest distance between the facing side end portions of the insulator 254 is a distance LE2. The shortest distance between the side end portion of the insulator 254 in a region in contact with the top surface of the conductor 242a and the side end portion of the insulator 254 in a region in contact with the top surface of the conductor 242b is a distance LE1.

As illustrated in FIG. 1(E), there is a curved surface between the side surface of the conductor 242b and the top surface of the conductor 242b in some cases. There is a curved surface between the side surface of the conductor 242a and the top surface of the conductor 242a in some cases. When the conductor 242a includes a curved surface between its side surface and top surface and/or the conductor 242b includes a curved surface between its side surface and top surface and the opening formed in the insulator 280 and the like has a tapered shape, the side end portion of the insulator 254 has a shape in which the distance LE2 is shorter than the distance LE1 in the channel length direction of the transistor 200 as illustrated in FIG. 3. Furthermore, in the case where the insulator 254 of the transistor 200 is seen from the above, the side end portion of the insulator 254 has a shape with a curve.

Note that the shape of the side end portion of the insulator 254 is evaluated using an EDX map obtained by EDX, for example. For example, in the case where aluminum oxide is used for the insulator 254, a shape in which the distance LE2 is shorter than the distance LE1 and/or a shape in which the side end portion includes a curve may be observed in a plan-view EDX map of an Al—K line.

Note that FIG. 1 and FIG. 2 illustrate an example in which the angle 244, the angle 258, and the angle 248 are substantially the same; however, the present invention is not limited thereto. The angle 244 may be different from the angle 258 and the angle 248. For example, insulating layers to be the insulator 280 and the insulator 254 are processed, an opening exposing a conductive layer to be the conductor 242a and the conductor 242b is formed, and then the conductive layer is etched using a gas that can generate an organic substance; thus, the angle 244 can be controlled. In this way, the angle 244 can be different from the angle 258 and the angle 248.

Accordingly, a semiconductor device including a transistor with high on-state current can be provided. A semiconductor device including a transistor having high frequency characteristics can be provided. A semiconductor device having suppressed variation in electrical characteristics, stable electrical characteristics, and improved reliability can be provided. In addition, a semiconductor device including a transistor having a low off-state current can be provided.

<<Estimation of Operation Frequency of Semiconductor Device by Calculation Using Device Simulator>>

Here, the estimation results of the operation frequency of a semiconductor device including a transistor of one embodiment of the present invention by calculation using a device simulator will be described with reference to FIG. 4 and FIG. 5.

Note that the semiconductor device in this section is a DRAM using a memory cell including one OS transistor and one capacitor. Note that a DRAM using a memory cell including one OS transistor and one capacitor is also referred to as a DOSRAM (registered trademark) (Dynamic Oxide Semiconductor Random Access Memory). The DOSRAM will be described in detail in the following embodiment.

The data retention time of a DOSRAM can be rephrased as a time taken for charges stored in a storage capacitor included in the DOSRAM to be reduced from the "amount after data writing" to a "certain amount". In this embodiment, the above "certain amount" is defined as a time taken for a potential applied to the capacitor (a storage capacitance of 3.5 fF) included in the DOSRAM to be reduced by 0.2 V from the state after data writing. For example, in this embodiment, DOSRAM data retention of one hour means that a time taken for a potential applied to the capacitor included in the DOSRAM to be reduced by 0.2 V from the state after data writing is one hour.

The data retention time of a DOSRAM depends on the amount of the off-leakage current of a transistor included in the DOSRAM. Here, the off-leakage current of a transistor can be rephrased as a drain current (Id) at a gate voltage (Vg) of the transistor of 0 V (i.e., Icut). For example, in the case where the data retention characteristic of a DOSRAM depends on only the amount of Icut of a transistor included in the DOSRAM, the data retention time of the DOSRAM is inversely proportional to the amount of Icut of the transistor included in the DOSRAM.

Note that Icut can be estimated by extrapolation using Formula (1) below on the basis of the shift value (Vsh) and the subthreshold swing value (Svalue). Here, Vsh is defined as, in the Id-Vg characteristics of a transistor, Vg at which the tangent at a point where the slope of the curve is the steepest intersects the straight line of Id=1 pA. Furthermore, Svalue refers to the amount of change in a gate voltage which makes the drain current change by one order of magnitude in a subthreshold region at a constant drain voltage. Note that Formula (1) is a formula that holds when the off-state current of a transistor is assumed to monotonously decrease in accordance with Svalue obtained by Vg-Id measurement until Vg reaches 0 V.

[Formula 1]

$$I_{cut} = (1\text{pA}) \times 10^{-\frac{V_{sh}}{S_{value}}} \quad (1)$$

From the above, the data retention time of the DOSRAM can be estimated by calculating Vsh and Svalue obtained from the Id-Vg characteristics.

The DOSRAM operation frequency is defined as the inverse of a data write cycle time of the DOSRAM. The data write cycle time of the DOSRAM is a parameter set by a charging time of the capacitor included in the DOSRAM, for example. In this embodiment, the time corresponding to 40% of the data write cycle time of the DOSRAM (the inverse of the DOSRAM operation frequency) is set as the charging time of the capacitor included in the DOSRAM.

As described above, the DOSRAM operation frequency depends on the charging time of the capacitor included in the DOSRAM. Therefore, in estimating the DOSRAM operation frequency, first, it is necessary to know the charging time of the capacitor included in the DOSRAM in advance. In this embodiment, a state where a potential of 0.55 V or higher is applied to the capacitor (a storage capacitance of 3.5 fF) included in the DOSRAM is defined as a "charged state" of the capacitor. Accordingly, in this embodiment, the time from when DOSRAM data write operation starts until when the potential applied to the capacitor reaches 0.55 V corresponds to the charging time of the capacitor included in the DOSRAM.

When a charge stored in a capacitor that is included in the DOSRAM and has a storage capacitance Cs [F] is Q [C], the charging time is t [sec], the potential applied to the capacitor by charging is Vcs (=Vs) [V], and the drain current of a transistor included in the DOSRAM is Id [A], the relation of Formula (2) shown below is established between the parameters.

[Formula 2]

$$I_d = \frac{dQ}{dt} = \frac{d}{dt}(C_s \times V_{cs}) = C_s \frac{dV_{cs}}{dt} \quad (2)$$

Therefore, by modification of Formula (2), the charging time t of the capacitor included in the DOSRAM can be represented by Formula (3) shown below.

[Formula 3]

$$t = \int_0^{V_{cs}} \frac{C_s \times dV_{cs}}{I_d} \quad (3)$$

As described above, in this embodiment, the state where the potential applied to the capacitor with a storage capacitance of 3.5 fF becomes 0.55 V or higher is defined as the "charged state" of the capacitor. Thus, in Formula (3), 3.5 fF is substituted for Cs, +0.55 V is substituted for Vcs, and the measured value or the calculated value of the transistor of one embodiment of the present invention is substituted for Id, whereby the charging time t of the capacitor included in the DOSRAM can be calculated.

The charging time of the capacitor included in the DOSRAM depends on the amount of Id of the transistor included in the DOSRAM at the time of DOSRAM data writing. In other words, the DOSRAM operation frequency can be estimated by obtaining the Id-Vs characteristics.

Hence, in this section, DOSRAM data write operation is expressed by actual application of a potential assumed to be applied to the transistor included in the DOSRAM at the time of DOSRAM data writing to the transistor of one embodiment of the present invention, and Id of the transistor at that time is measured. Specifically, Id of the transistor is measured under conditions where the gate potential of the transistor is fixed to +2.97 V, the drain potential is fixed to +1.08 V, the back gate potential is a given value, and the source potential is swept from 0 V to +0.55 V. Note that the measurement temperature is set at 27° C.

Furthermore, the data retention time and operation frequency of the DOSRAM are calculated by calculating Id-Vg characteristics and Id-Vs characteristics of the transistor of one embodiment of the present invention using the device simulator under the above conditions. Note that in calculation of the data retention time, current leakage and deterioration of element characteristics due to long-term retention are not considered.

Figure 4A:
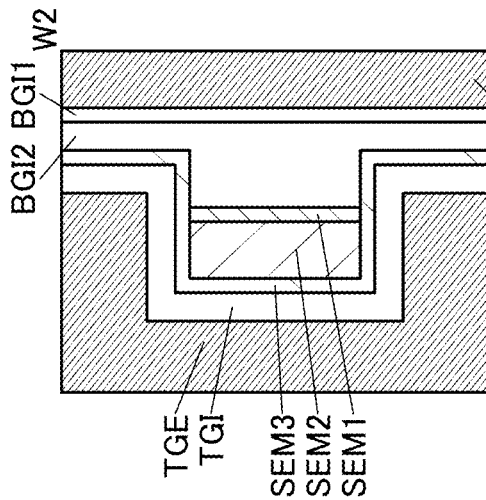
FIG. 4 (A), (B), (C), (D) A top view and cross-sectional views of a transistor of one embodiment of the present invention.
Figure 4D:
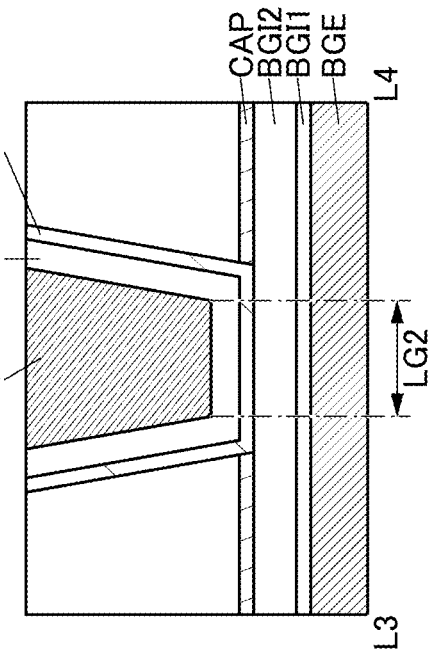
Figure 4B:
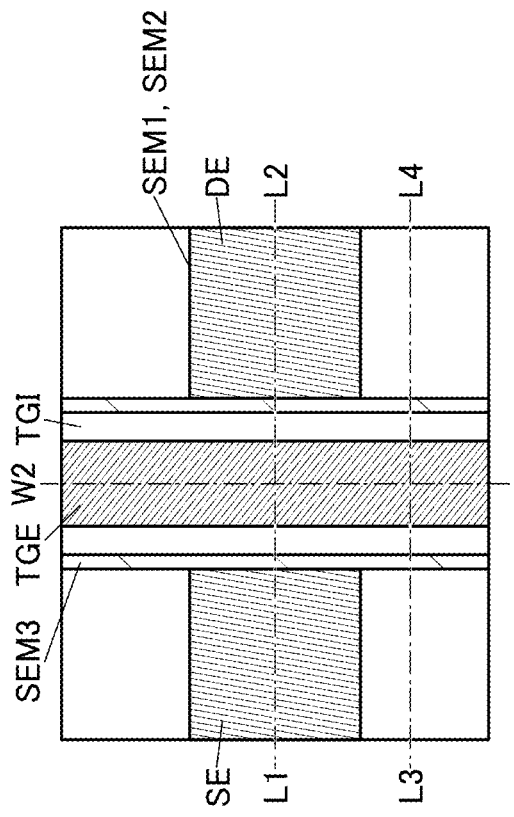
Figure 4C:
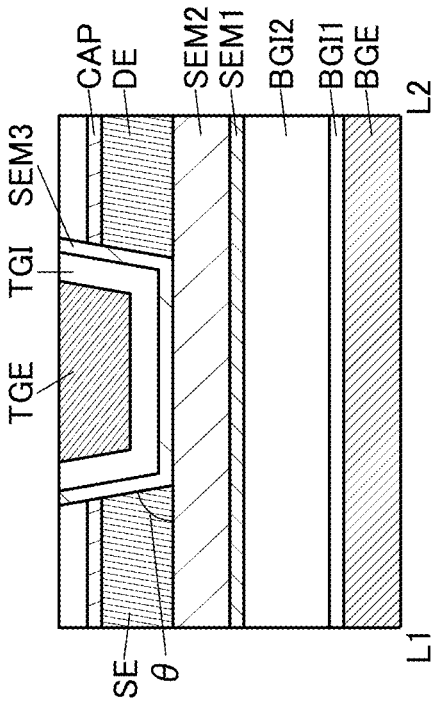

FIG. 4(A) to FIG. 4(D) show a transistor assumed in the calculation using the device simulator. FIG. 4(A) is a top view of the transistor. FIG. 4(B) to FIG. 4(D) are cross-sectional views of the transistor. Here, FIG. 4(B) is a cross-sectional view of a portion indicated by dashed-dotted line L1-L2 in FIG. 4(A), and is also a cross-sectional view in the channel length direction of the transistor. FIG. 4(C) is a cross-sectional view of a portion indicated by dashed-dotted line L3-L4 in FIG. 4(A), and is also a cross-sectional view in the channel length direction of the transistor. FIG. 4(D) is a cross-sectional view of a portion indicated by dashed-dotted line W1-W2 in FIG. 4(A), and is also a cross-sectional view in the channel width direction of the transistor. Note that for clarification of the drawing, some components are omitted in the top view in FIG. 4(A).

In FIG. 4, a conductor BGE is a back gate electrode and corresponds to the conductor 205 of the transistor 200 shown in FIG. 1. An insulator BGI1 and an insulator BGI2 are back gate insulators and correspond to the insulator 222 and the insulator 224, respectively, of the transistor 200 shown in FIG. 1. A semiconductor SEM1, a semiconductor SEM2, and a semiconductor SEM3 are semiconductor layers and correspond to the oxide 230a, the oxide 230b, and the oxide 230c, respectively, of the transistor 200 shown in FIG. 1. A conductor SE is a source electrode and corresponds to one of the conductor 242a and the conductor 242b of the transistor 200 shown in FIG. 1. A conductor DE is a drain electrode and corresponds to the other of the conductor 242a and the conductor 242b of the transistor 200 shown in FIG. 1. An insulator CAP is a barrier film and corresponds to the insulator 254 of the transistor 200 shown in FIG. 1. An insulator TGI is a top gate insulator and corresponds to the insulator 250 of the transistor 200 shown in FIG. 1. A conductor TGE is a top gate electrode and corresponds to the conductor 260 of the transistor 200 shown in FIG. 1. In the transistor structure shown in FIG. 4, the angle 248 shown in FIG. 1(C), the angle 244 shown in FIG. 2(A), and the angle 258 shown in FIG. 2(B) are the same angle.

In this calculation, transistors that have the structure shown in FIG. 4 but have different sizes (structure 1A to structure 3A) are prepared. Of parameters assumed in the calculation using the device simulator, Table 1 shows parameters which are different among the structure 1A to the structure 3A.

TABLE 1

| Structure | θ (°) | LG2 (nm) |
|---|---|---|
| 1A | 89 | 49.3 |
| 2A | 80 | 42.5 |
| 3A | 70 | 33.5 |

An angle θ in Table 1 is an angle formed by a plane parallel to a bottom surface of the conductor SE and a side surface of the conductor SE, which faces the conductor DE, and is also an angle formed by a plane parallel to a bottom surface of the conductor DE and a side surface of the conductor DE, which faces the conductor SE. Note that the angle θ corresponds to the angle 244 shown in FIG. 2(A). A length LG2 in Table 1 is a length of a bottom surface of the conductor TGE in a region where the semiconductor SEM2 and the semiconductor SEM1 do not overlap with the conductor TGE in the channel length direction of the transistor as shown in FIG. 4(C). Note that the length LG2 is calculated using the angle θ and parameters in Table 2. It is found from Table 1 that the smaller the angle θ is, the shorter the length LG2 is.

The calculation using the device simulator is performed on the structure 1A to the structure 3A. A device simulator Atlas 3D produced by Silvaco, Inc. is used as the device simulator. Of parameters assumed in the calculation using the device simulator, parameters common to the structure 1A to the structure 3A are shown in Table 2.

TABLE 2

| Structure | | Channel length L | 80 | nm |
|---|---|---|---|---|
| | | Channel width W | 60 | nm |
| SEM1 | IGZO(134) | Electron affinity | 4.5 | eV |
| | | Band gap | 3.4 | eV |
| | | Electron mobility | 0.1 | cm$^2$/(V s) |
| | | Hole mobility | 0.01 | cm$^2$/(V s) |
| | | Film thickness | 5 | nm |
| SEM2 | IGZO(423) | Electron affinity | 4.8 | eV |
| SEM3 | | Band gap | 2.9 | eV |
| | | Electron mobility | 20 | cm$^2$/(V s) |
| | | Hole mobility | 0.01 | cm$^2$/(V s) |
| | | Film thickness (SEM2) | 15 | nm |
| | | Film thickness (SEM3) | 5 | nm |
| SEM | | Relative permittivity | 15 | |
| | | Effective density of states in conduction band, Nc | 5 × 10$^{18}$ | cm$^{-3}$ |
| | | Effective density of states in valence band, Nv | 5 × 10$^{18}$ | cm$^{-3}$ |
| TGE | | Work function | 5.0 | eV |
| | | Film thickness | 20 | nm |
| TGI | | Relative permittivity | 4.1 | |
| | | Film thickness | 10 | nm |
| CAP | | Relative permittivity | 8.3 | |
| | | Film thickness | 8 | nm |
| SE, DE | | Work function | 4.8 | eV |
| | | Film thickness | 20 | nm |
| BGI2 | | Relative permittivity | 4.1 | |
| | | Film thickness | 30 | nm |
| BGI1 | | Relative permittivity | 16.4 | |
| | | Film thickness | 5 | nm |
| BGE | | Work function | 5.0 | eV |
| | | Film thickness | 20 | nm |

IGZO(134) shown in Table 2 is assumed to be an In—Ga—Zn oxide with a composition of In:Ga:Zn=1:3:4. IGZO (423) shown in Table 2 is assumed to be an In—Ga—Zn oxide with a composition of In:Ga:Zn=4:2:3. The parameters of SEM shown in Table 2 are parameters common to the semiconductor SEM1, the semiconductor SEM2, and the semiconductor SEM3.

Figure 5A:
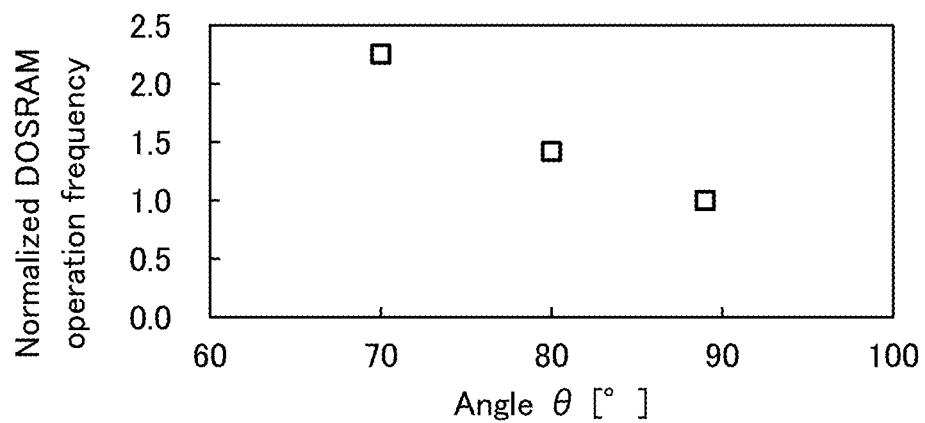
FIG. 5 (A), (B), (C) Diagrams showing electrical characteristics of transistors of embodiments of the present invention and operation frequency of semiconductor devices of embodiments of the present invention.

FIG. 5(A) shows estimated DOSRAM operation frequencies of the DOSRAM having the structure 1A, the DOSRAM having the structure 2A, and the DOSRAM having the structure 3A at a power supply voltage of 3.3 V and a temperature of 27° C. Note that the DOSRAM operation frequencies shown in FIG. 5(A) are standardized so that the DOSRAM operation frequency of the structure 1A is 1. In FIG. 5(A), the horizontal axis represents the angle θ[°] and the vertical axis represents the standardized DOSRAM operation frequency. It can be found from FIG. 5(A) that the smaller the angle θ' is, the higher the DOSRAM frequency is.

<<Evaluation of Electrical Characteristics of Transistor by Calculation Using Device Simulator>>

Next, changes in on-state current of the transistor 200 when the angle 244 shown in FIG. 2(A) is changed are evaluated by calculation using the device simulator. Specifically, Svalue and the on-state current of each of the structure 1A to the structure 3A are calculated. Id-Vg characteristics of the structure 1A to the structure 3A at a drain voltage Vd of 1.2 V are calculated, and Svalue and the on-state current Ion are calculated. Here, Ion is a current value at a gate voltage Vg of Vsh+3.0 V. Note that the back gate voltage Vbg is a given value.

Figure 5B:
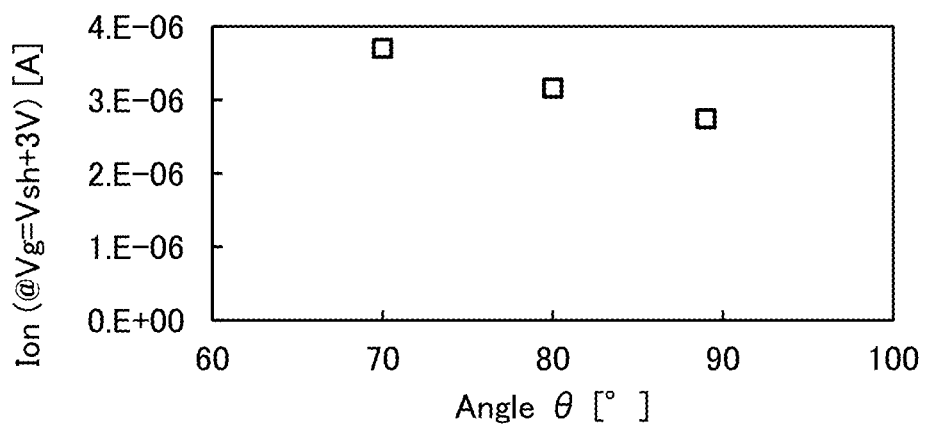

FIG. 5(B) shows the calculated Ion of each of the structure 1A to the structure 3A. In FIG. 5(B), the horizontal axis represents the angle θ[°], and the vertical axis represents Ion [A]. It can be found from FIG. 5(B) that the smaller the angle θ is, the larger Ion is.

Figure 5C:
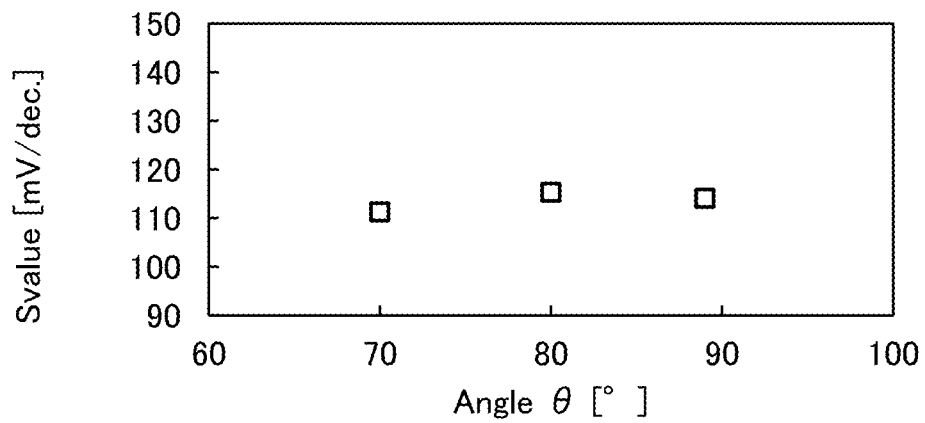

FIG. 5(C) shows the calculated Svalue of each of the structure 1A to the structure 3A. In FIG. 5(C), the horizontal axis represents the angle θ[°], and the vertical axis represents Svalue [mV/dec.]. According to FIG. 5(C), the amount of change in Svalue with respect to change in the angle θ is smaller than the amount of change in Ion. Accordingly, it can be found that the angle θ makes a large contribution to Ion and a small contribution to Svalue.

The above results indicate that the smaller the angle θ is, the larger Ion of the transistor is and thus the operation frequency of the semiconductor device including the transistor is improved. This is probably because the smaller the angle θ is, the narrower the width of a region of the conductor SE or the conductor DE, which does not overlap with the conductor TGE, i.e., the offset region, is.

<<Specific Structure of Semiconductor Device>>

The structure of the semiconductor device including the transistor 200 of one embodiment of the present invention is described in detail below.

The conductor 205 is positioned to overlap with the oxide 230 and the conductor 260. Furthermore, the conductor 205 is preferably provided to be embedded in the insulator 216.

The conductor 260 sometimes functions as a first gate (also referred to as a top gate) electrode. The conductor 205 sometimes functions as a second gate (also referred to as a bottom gate) electrode. In that case, the threshold voltage (Vth) of the transistor 200 can be controlled by changing a potential applied to the conductor 205 independently of a potential applied to the conductor 260. In particular, by applying a negative potential to the conductor 205, Vth of the transistor 200 can be further increased, and the off-state current can be reduced. Thus, a drain current when a potential applied to the conductor 260 is 0 V can be smaller in the case where a negative potential is applied to the conductor 205 than in the case where the negative potential is not applied to the conductor 205.

Note that as illustrated in FIG. 1(A), the conductor 205 is preferably provided larger than the region 234 of the oxide 230. As illustrated in FIG. 1(D), it is particularly preferable that the conductor 205 extend to an outer region than an end portion of the region 234 of the oxide 230b that intersects with the channel width direction. That is, the conductor 205 and the conductor 260 preferably overlap with each other with the insulators therebetween on an outer side of the side surface of the oxide 230 in the channel width direction.

With the above structure, the channel formation region in the region 234 can be electrically surrounded by the electric field of the conductor 260 functioning as the first gate electrode and the electric field of the conductor 205 functioning as the second gate electrode. In this specification, the transistor structure in which the channel formation region is electrically surrounded by the electric fields of the first gate electrode and the second gate electrode is referred to as a surrounded channel (S-channel) structure.

Moreover, a conductive material containing tungsten, copper, or aluminum as its main component is preferably used for the conductor 205. Note that the conductor 205 is illustrated as a single layer but may have a stacked-layer structure, for example, a stacked-layer structure of any of the above conductive materials and titanium or titanium nitride.

The insulator 214 preferably functions as a barrier insulating film that inhibits impurities such as water and hydrogen from diffusing to the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (or an insulating material through which the above impurities are less likely to pass). Alternatively, it is preferable to use an insulating material having a function of inhibiting diffusion of oxygen (e.g., at least one of an oxygen atom, an oxygen molecule, and the like) (or an insulating material through which the above oxygen is less likely to pass).

For example, it is preferable that silicon nitride or the like be used for the insulator 214. Accordingly, impurities such as water and hydrogen can be inhibited from diffusing to the transistor 200 side from the substrate side of the insulator 214. Alternatively, oxygen included in the insulator 224 or the like can be inhibited from diffusing to the substrate side of the insulator 214.

The insulator 216, the insulator 280, and the insulator 281 preferably have a lower dielectric constant than the insulator 214. When a material having a low dielectric constant is used for an interlayer film, parasitic capacitance generated between wirings can be reduced. For the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used, for example.

The insulator 222 and the insulator 224 function as gate insulators.

Here, it is preferable that oxygen be released from the insulator 224 in contact with the oxide 230 by heating. In this specification, oxygen that is released by heating is referred to as excess oxygen in some cases. For example, silicon oxide, silicon oxynitride, or the like is used for the insulator 224 as appropriate. When an insulator containing oxygen is provided in contact with the oxide 230, oxygen vacancies in the oxide 230 can be reduced and the reliability of the transistor 200 can be improved.

For the insulator 224, specifically, an oxide material from which part of oxygen is released by heating is preferably used. An oxide film from which oxygen is released by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the film surface temperature in the TDS analysis is preferably higher than or equal to 100° C. and lower than or equal to 700° C., or higher than or equal to 100° C. and lower than or equal to 400° C.

As illustrated in FIG. 1(D), the thickness of the insulator 224 in a region that overlaps with neither the insulator 254 nor the oxide 230b is smaller than the thickness in the other region in some cases. The region in the insulator 224 that overlaps with neither the insulator 254 nor the oxide 230b preferably has such a thickness that the above oxygen can adequately diffuse.

The insulator 222 preferably functions as a barrier insulating film that inhibits impurities such as water and hydrogen from diffusing to the transistor 200 from the substrate side. For example, the insulator 222 preferably has lower hydrogen permeability than the insulator 224. By surrounding the insulator 224, the oxide 230, and the like with the insulator 222 and the insulator 254, diffusion of impurities such as water and hydrogen to the transistor 200 from the outside can be inhibited.

Furthermore, the insulator 222 preferably has a function of inhibiting diffusion of oxygen (e.g., at least one of an oxygen atom, an oxygen molecule, and the like) (or is preferably less likely to transmit the above oxygen). For example, the insulator 222 preferably has the property of being less likely to transmit oxygen than the insulator 224. The insulator 222 preferably has a function of inhibiting diffusion of oxygen or impurities, in which case diffusion of oxygen included in the oxide 230 to the insulator 220 side can be reduced. Furthermore, the conductor 205 can be inhibited from reacting with oxygen included in the insulator 224 or the oxide 230.

For the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and diffusion of impurities such as hydrogen from the periphery of the transistor 200 to the oxide 230.

Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

For example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of transistors, a problem such as leakage current may arise because of a thinner gate insulator. When a high-k material is used for an insulator functioning as the gate insulator, a gate potential during operation of the transistor can be reduced while the physical thickness of the gate insulator is kept.

Note that the insulator 222 and the insulator 224 may each have a stacked-layer structure of two or more layers. In that case, without limitation to a stacked-layer structure formed of the same material, a stacked-layer structure formed of different materials may be employed.

The oxide 230 includes the oxide 230a, the oxide 230b over the oxide 230a, and the oxide 230c over the oxide 230b. When the oxide 230a is provided below the oxide 230b, impurities can be inhibited from diffusing into the oxide 230b from the components formed below the oxide 230a. When the oxide 230c is provided over the oxide 230b, impurities can be inhibited from diffusing into the oxide 230b from the components formed above the oxide 230c.

Note that the oxide 230 preferably has a stacked-layer structure using oxides with different chemical compositions. Specifically, the atomic ratio of the element M to constituent elements of main components in the metal oxide used for the oxide 230a is preferably greater than the atomic ratio of the element M to constituent elements of main components in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c.

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. This can reduce oxygen extraction from the oxide 230b even when heat treatment is performed; hence, the transistor 200 is stable with respect to high temperatures in the manufacturing process (what is called thermal budget).

The conduction band minimum of each of the oxide 230a and the oxide 230c is preferably closer to the vacuum level than the conduction band minimum of the oxide 230b. In other words, the electron affinity of each of the oxide 230a and the oxide 230c is preferably smaller than the electron affinity of the oxide 230b.

The conduction band minimum gradually changes at a junction portion of the oxide 230a, the oxide 230b, and the oxide 230c. In other words, the conduction band minimum at a junction portion of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, for the oxide 230a, a metal oxide with In:Ga:Zn=1:3:4 [atomic ratio] or 1:1:0.5 [atomic ratio] is used. For the oxide 230b, a metal oxide with In:Ga:Zn=4:2:3 [atomic ratio] or 3:1:2 [atomic ratio] is used. For the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the case where the oxide 230c has a stacked-layer structure are a stacked-layer structure of In:Ga:Zn=4:2:3 [atomic ratio] and In:Ga:Zn=1:3:4 [atomic ratio], a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], a stacked-layer structure of In Ga:Zn=4:2:3 [atomic ratio] and gallium oxide, and the like.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current and excellent frequency characteristics. Note that in the case where the oxide 230c has a stacked-layer structure, in addition to the above effect of reducing the density of defect states at the interface between the oxide 230b and the oxide 230c, the effect of inhibiting diffusion of a constituent element included in the oxide 230c to the insulator 250 side should be obtained. More specifically, the oxide 230c has a stacked-layer structure and an oxide not including In is positioned in the upper portion of the stacked-layer structure, so that In can be inhibited from diffusing to the insulator 250 side. Since the insulator 250 functions as the gate insulator, the transistor has defects in characteristics when In enters the insulator 250 or the like. Thus, when the oxide 230c has a stacked-layer structure, a highly reliable semiconductor device can be provided.

For the oxide 230, a metal oxide functioning as an oxide semiconductor is preferably used. For example, as a metal oxide to be the region 234, a metal oxide having a band gap of 2 eV or more, preferably 2.5 eV or more, is preferably used. With the use of a metal oxide having such a wide band gap, the off-state current of the transistor can be reduced. With the use of such a transistor, a semiconductor device with low power consumption can be provided.

The conductor 242 (the conductor 242a and the conductor 242b) functioning as the source electrode and the drain electrode is provided over the oxide 230b. The thickness of the conductor 242 is, for example, greater than or equal to 1 nm and less than or equal to 50 nm, preferably greater than or equal to 2 nm and less than or equal to 25 nm.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

Like the insulator 214 and the like, the insulator 254 preferably functions as a barrier insulating film that inhibits impurities such as water and hydrogen from diffusing to the transistor 200 from the insulator 280 side. For example, the insulator 254 preferably has the property of being less likely to transmit hydrogen than the insulator 224. As illustrated in FIG. 1(B) and FIG. 1(D), the insulator 254 is preferably in contact with the top surface and side surface of the conductor 242a, the top surface and side surface of the conductor 242b, the side surfaces of the oxide 230a and the oxide 230b, and the top surface of the insulator 224. Such a structure can inhibit diffusion of hydrogen included in the insulator 280 into the oxide 230 through the top surfaces or side surfaces of the conductor 242a, the conductor 242b, the oxide 230a, the oxide 230b, and the insulator 224.

As described above, the insulator 224 and the oxide 230 are covered with the insulator 254 having a barrier property against hydrogen, whereby the insulator 280 is isolated from the insulator 224 and the oxide 230 by the insulator 254. This inhibits diffusion of impurities such as hydrogen from the outside of the transistor 200, resulting in favorable electrical characteristics and reliability of the transistor 200.

Furthermore, it is preferable that the insulator 254 have a function of inhibiting diffusion of oxygen (e.g., at least one of an oxygen atom, an oxygen molecule, and the like) (or be less likely to transmit the above oxygen). For example, the insulator 254 preferably has the property of being less likely to transmit oxygen than the insulator 224.

The insulator 254 is preferably deposited by a sputtering method. When the insulator 254 is deposited in an atmosphere containing oxygen by a sputtering method, oxygen can be added to the vicinity of a region of the insulator 224 in contact with the insulator 254. Accordingly, oxygen can be supplied from the region to the oxide 230 through the insulator 224. Here, with the insulator 254 having a function of inhibiting upward diffusion of oxygen, oxygen can be prevented from diffusing from the oxide 230 into the insulator 280. Moreover, with the insulator 222 having a function of inhibiting downward diffusion of oxygen, oxygen can be prevented from diffusing from the oxide 230 into the insulator 216. In the above manner, oxygen is supplied to the region 234 functioning as the channel formation region of the oxide 230. Accordingly, oxygen vacancies in the oxide 230 can be reduced, so that the transistor can be inhibited from becoming normally on.

For example, an insulator containing an oxide of one or both of aluminum and hafnium is preferably deposited as the insulator 254.

The insulator 254 can have a multilayer structure of two or more layers. For example, the insulator 254 may have a two-layer structure in which the first layer is deposited by a sputtering method in an oxygen-containing atmosphere and then the second layer is deposited by an ALD method. An ALD method is a deposition method achieving excellent coverage, and thus can prevent formation of disconnection or the like due to unevenness of the first layer. Note that a multilayer structure of different materials may be employed in the case where the insulator 254 has a multilayer structure of two or more layers. For example, a stacked-layer structure of silicon oxide, silicon oxynitride, silicon nitride oxide, or silicon nitride and an insulator having a function of inhibiting passage of oxygen and impurities such as hydrogen may be employed. As the insulator having a function of inhibiting passage of oxygen and impurities such as hydrogen, an insulator containing an oxide of one or both of aluminum and hafnium can be used, for example.

The insulator 250 functions as a gate insulator. The insulator 250 is preferably positioned in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

Like the insulator 224, the insulator 250 is preferably formed using an insulator from which oxygen is released by heating. When an insulator from which oxygen is released by heating is provided as the insulator 250 in contact with the top surface of the oxide 230c, oxygen can be effectively supplied to the region 234 of the oxide 230b. Furthermore, as in the insulator 224, the concentration of an impurity such as water or hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 to the conductor 260. Provision of the metal oxide that inhibits diffusion of oxygen inhibits diffusion of oxygen from the insulator 250 to the conductor 260. That is, a reduction in the amount of oxygen supplied to the oxide 230 can be inhibited. In addition, oxidation of the conductor 260 due to oxygen from the insulator 250 can be inhibited.

The metal oxide functions as part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Accordingly, a gate potential that is applied during operation of the transistor can be reduced while the physical thickness of the gate insulator is kept. In addition, the equivalent oxide thickness (EOT) of an insulator functioning as the gate insulator can be reduced.

Specifically, a metal oxide containing one or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium such as aluminum oxide, hafnium oxide, or an oxide containing aluminum and hafnium (hafnium aluminate).

Although the conductor 260 has a two-layer structure in FIG. 1, a single-layer structure or a stacked-layer structure of three or more layers may be employed.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, the conductivity of the conductor 260b can be inhibited from being lowered because of oxidation due to oxygen included in the insulator 250. As a conductive material having a function of inhibiting diffusion of oxygen, for example, tantalum, tantalum nitride, ruthenium, ruthenium oxide, or the like is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of any of the above conductive materials and titanium or titanium nitride.

The insulator 280 is provided over the insulator 224, the oxide 230, and the conductor 242 with the insulator 254 therebetween. For example, for the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which are thermally stable, are preferable. Materials such as silicon oxide, silicon oxynitride, and porous silicon oxide, in each of which a region containing oxygen that is released by heating can be easily formed, are particularly preferable.

The concentration of an impurity such as water or hydrogen in the insulator 280 is preferably lowered. A top surface of the insulator 280 may be planarized.

Like the insulator 210 and the like, the insulator 274 preferably functions as a barrier insulating film that inhibits impurities such as water and hydrogen from diffusing to the insulator 280 from above. The insulator 274 is formed using an insulator that can be used for the insulator 210 or the insulator 254, for example.

The insulator 281 functioning as an interlayer film is preferably provided over the insulator 274. As in the insulator 224 and the like, the concentration of an impurity such as water or hydrogen in the film of the insulator 281 is preferably lowered.

The conductor 240a and the conductor 240b are positioned in the openings formed in the insulator 281, the insulator 274, the insulator 280, and the insulator 254. The conductor 240a and the conductor 240b are positioned to face each other with the conductor 260 interposed therebetween. Note that the top surfaces of the conductor 240a and the conductor 240b may be on the same surface as the top surface of the insulator 281.

Note that the insulator 241a is provided in contact with the side wall of the opening in the insulator 281, the insulator 274, the insulator 280, and the insulator 254 and the first conductor of the conductor 240a is formed in contact with its side surface. The conductor 242a is located on at least part of the bottom portion of the opening, and thus the conductor 240a is in contact with the conductor 242a. Similarly, the insulator 241b is provided in contact with the side wall of the opening in the insulator 281, the insulator 274, the insulator 280, and the insulator 254, and the first conductor of the conductor 240b is formed in contact with its side surface. The conductor 242b is located on at least part of the bottom portion of the opening, and thus the conductor 240b is in contact with the conductor 242b.

For the conductor 240a and the conductor 240b, a conductive material containing tungsten, copper, or aluminum as its main component is preferably used. In addition, the conductor 240a and the conductor 240b may have a stacked-layer structure In the case where the conductor 240 has a stacked-layer structure, a conductive material having a function of inhibiting passage of impurities such as water and hydrogen is preferably used for a conductor in contact with the oxide 230a, the oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. A single layer or stacked layers of the conductive material having a function of inhibiting passage of impurities such as water and hydrogen may be used. The use of the conductive material can prevent oxygen added to the insulator 280 from being absorbed by the conductor 240*a* and the conductor 240*b*. Moreover, impurities such as water and hydrogen contained in a layer above the insulator 281 can be inhibited from diffusing to the oxide 230 through the conductor 240*a* and the conductor 240*b*.

For the insulator 241*a* and the insulator 241*b*, an insulator that can be used for the insulator 254 is used, for example. Since the insulator 241*a* and the insulator 241*b* are provided in contact with the insulator 254, impurities such as water and hydrogen contained in the insulator 280 or the like can be inhibited from diffusing to the oxide 230 through the conductor 240*a* and the conductor 240*b*. In addition, oxygen contained in the insulator 280 can be prevented from being absorbed by the conductor 240*a* and the conductor 240*b*.

Although not illustrated, a conductor functioning as a wiring may be positioned in contact with the top surface of the conductor 240*a* and the top surface of the conductor 240*b*. For the conductor functioning as a wiring, a conductive material containing tungsten, copper, or aluminum as its main component is preferably used. The conductor may have a stacked-layer structure, for example, a stacked-layer structure of any of the above conductive materials and titanium or titanium nitride. Note that the conductor may be formed to be embedded in an opening provided in an insulator.

<Constituent Material of Semiconductor Device>

Constituent materials that can be used for the semiconductor device will be described below.

<<Substrate>>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like and a compound semiconductor substrate including silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

With miniaturization and high integration of a transistor, a problem such as leakage current may arise because of a thinner gate insulator. When a high-k material is used for an insulator functioning as the gate insulator, a voltage during operation of the transistor can be reduced while the physical thickness of the gate insulator is kept. By contrast, when a material with a low relative permittivity is used for the insulator functioning as an interlayer film, the parasitic capacitance generated between wirings can be reduced. Accordingly, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting passage of oxygen and impurities such as hydrogen (e.g., the insulator 214, the insulator 222, the insulator 254, the insulator 274, and the like), the electrical characteristics of the transistor can be stabilized. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, for the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, aluminum titanium nitride, titanium nitride, silicon nitride oxide, or silicon nitride can be used.

In addition, the insulator functioning as the gate insulator is preferably an insulator including a region containing oxygen that is released by heating. When a structure is employed in which silicon oxide or silicon oxynitride including a region containing oxygen that is released by heating is in contact with the oxide 230, oxygen vacancies included in the oxide 230 can be compensated for.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably employed as the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen included in the metal oxide in which a channel is formed can be trapped in some cases. Alternatively, hydrogen mixed from an external insulator or the like can be trapped in some cases.

<<Metal oxide>>

For the oxide 230, a metal oxide functioning as an oxide semiconductor is preferably used. A metal oxide that can be used for the oxide 230 of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M.

Note that in this specification and the like, a metal oxide containing nitrogen is also referred to as a metal oxide in some cases. Alternatively, a metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (InMZn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, mixing of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In some cases, IGZO has a stable structure when formed of smaller crystals (e.g., the above-described nanocrystals) rather than larger crystals (here, crystals with a size of several millimeters or several centimeters) because crystal growth tends to hardly occur particularly in the air.

An a-like OS is a metal oxide having a structure between those of the nc-OS and an amorphous oxide semiconductor. The a-like OS contains a void or a low-density region. That is, the a-like OS has low crystallinity as compared with the nc-OS and the CAAC-OS.

The oxide semiconductor (metal oxide) can have various structures which show different properties. Two or more kinds of the amorphous oxide semiconductor, the polycrystalline oxide semiconductor, the a-like OS, the nc-OS, and the CAAC-OS may be included in the oxide semiconductor of one embodiment of the present invention.

[Impurities]

Here, the influence of each impurity in the metal oxide will be described.

When the metal oxide contains an alkali metal or an alkaline earth metal, defect states are formed and carriers are generated, in some cases. Thus, a transistor using a metal oxide that contains an alkali metal or an alkaline earth metal in its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS (the concentration obtained by secondary ion mass spectrometry (SIMS)) is set lower than or equal to $1 \times 10^{18}$ atoms/cm$^3$, preferably lower than or equal to $2 \times 10^{16}$ atoms/cm$^3$.

Hydrogen included in a metal oxide reacts with oxygen bonded to a metal atom to become water, and thus forms an oxygen vacancy, in some cases. When hydrogen enters the oxygen vacancy, an electron which is a carrier is generated in some cases. Furthermore, in some cases, bonding of part of hydrogen to oxygen bonded to a metal atom causes generation of an electron which is a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide, which is obtained by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide in which impurities are sufficiently reduced is used in a channel formation region of a transistor, stable electrical characteristics can be given.

As a metal oxide used for a semiconductor of a transistor, a thin film having high crystallinity is preferably used. With the use of the thin film, the stability or the reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing process cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a low-power-consumption CPU applying a characteristic of low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristic of a low leakage current of the transistor have been studied.

<Method for Manufacturing Semiconductor Device>

Next, a method for manufacturing a semiconductor device including the transistor 200 of the present invention, which is illustrated in FIG. 1, will be described with reference to FIG. 6 to FIG. 13. In FIG. 6 to FIG. 13, (A) of each drawing is a top view. Moreover, (B) of each drawing is a cross-sectional view corresponding to a portion indicated by dashed-dotted line L1-L2 in (A), and is also a cross-sectional view in the channel length direction of the transistor 200. Furthermore, (C) of each drawing is a cross-sectional view corresponding to a portion indicated by dashed-dotted line W1-W2 in (A), and is also a cross-sectional view in the channel width direction of the transistor 200. Note that for clarification of the drawings, some components are omitted in the top view in (A) of each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In this case, accumulated charges might break the wiring, electrode, element, or the like included in the semiconductor device. By contrast, in the case of a thermal CVD method that does not use plasma, such plasma damage is not caused and the yield of the semiconductor device can be increased. Furthermore, a thermal CVD method does not cause plasma damage during deposition, so that a film with few defects can be obtained.

In an ALD method, one atomic layer can be deposited at a time using self-regulating characteristics of atoms. Hence, an ALD method has effects such as deposition of an extremely thin film, deposition on a component with a large aspect ratio, deposition of a film with a small number of defects such as pinholes, deposition with excellent coverage, and low-temperature deposition. An ALD method includes a PEALD (Plasma Enhanced ALD) method using plasma. The use of plasma is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and thus is suitable for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

A CVD method and an ALD method enable control of the composition of a film to be obtained with a flow rate ratio of the source gases. For example, by a CVD method or an ALD method, a film with a certain composition can be deposited depending on a flow rate ratio of the source gases. Moreover, by a CVD method or an ALD method, by changing the flow rate ratio of the source gases during the deposition, a film whose composition is continuously changed can be deposited. In the case of depositing while changing the flow rate ratio of the source gases, as compared with the case of depositing with the use of a plurality of deposition chambers, a time taken for the deposition can be shortened because a time taken for transfer and pressure adjustment is omitted. Thus, productivity of semiconductor devices can be improved in some cases.

In this embodiment, for the insulator 214, silicon nitride is deposited by a CVD method. As described here, an insulator through which copper is less likely to pass, such as silicon nitride, is used for the insulator 214; accordingly, even when a metal that is likely to diffuse, such as copper, is used for a conductor in a layer (not illustrated) below the insulator 214, diffusion of the metal to a layer above the insulator 214 can be inhibited.

Then, a conductive film to be the conductor 205 is deposited over the insulator 214. The conductive film to be the conductor 205 can be deposited by a sputtering method, a CVD method, an MBE method, a PLD method, an ALD method, or the like. The conductive film to be the conductor 205 can be a multilayer film. In this embodiment, tungsten is deposited as the conductive film to be the conductor 205.

Next, the conductive film to be the conductor 205 is processed by a lithography method, so that the conductor 205 is formed.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

A hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 205, forming a resist mask thereover, and then etching the hard mask material. The etching of the conductive film to be the conductor 205 may be performed after removal of the resist mask or with the resist mask remaining. In the latter case, the resist mask sometimes disappears during the etching. The hard mask may be removed by etching after the etching of the conductive film to be the conductor 205. The hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency voltage is applied to one of the parallel plate type electrodes. Alternatively, a structure may be employed in which different high-frequency voltages are applied to one of the parallel plate type electrodes. Alternatively, a structure may be employed in which high-frequency voltages with the same frequency are applied to the parallel plate type electrodes. Alternatively, a structure may be employed in which high-frequency voltages with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 216 is deposited over the insulator 214 and the conductor 205. The insulating film to be the insulator 216 can be deposited by a sputtering method, a CVD method, an MBE method, a PLD method, an ALD method, or the like. In this embodiment, for the insulating film to be insulator 216, silicon oxide is deposited by a CVD method.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the thickness of the conductor 205 is 150 nm and the thickness of the insulating film to be the insulator 216 is 350 nm.

Next, CMP (chemical Mechanical Polishing) treatment is performed on the insulating film to be the insulator 216, so that part of the insulating film to be the insulator 216 is removed and a surface of the conductor 205 is exposed. Thus, the conductor 205 and the insulator 216 whose top surfaces are flat can be formed (see FIG. 6).

Here, a method for forming the conductor 205 which is different from the above will be described below.

The insulator 216 is deposited over the insulator 214. The insulator 216 can be deposited by a sputtering method, a CVD method, an MBE method, a PLD method, an ALD method, or the like.

Then, an opening reaching the insulator 214 is formed in the insulator 216. Note that examples of the opening include a groove and a slit. A region where the opening is formed may be referred to as an opening portion. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where a silicon oxide film is used as the insulator 216 in which the groove is to be formed, a silicon nitride film, an aluminum oxide film, or a hafnium oxide film is preferably used as the insulator 214.

After the formation of the opening, a conductive film to be the conductor 205 is deposited. The conductive film preferably includes a conductor that has a function of inhibiting oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 205 can be deposited by a sputtering method, a CVD method, an MBE method, a PLD method, an ALD method, or the like.

In this embodiment, the conductive film to be the conductor 205 has a multilayer structure. First, tantalum nitride is deposited by a sputtering method, and titanium nitride is stacked over the tantalum nitride. Even when a metal that is likely to diffuse, such as copper, is used for an upper layer of the conductive film to be the conductor 205 described below, the use of such metal nitrides for a lower layer of the conductive film to be the conductor 205 can prevent outward diffusion of the metal from the conductor 205.

Next, a conductive film that is the upper layer of the conductive film to be the conductor 205 is deposited. The conductive film can be deposited by a plating method, a sputtering method, a CVD method, an MBE method, a PLD method, an ALD method, or the like. In this embodiment, for the conductive film that is the upper layer of the conductive film to be the conductor 205, a low-resistance conductive material such as copper is deposited.

Next, CMP treatment is performed to remove parts of the upper layer of the conductive film to be the conductor 205 and the lower layer of the conductive film to be the conductor 205, so that the insulator 216 is exposed. As a result, the conductive film to be the conductor 205 remains only in the opening portion. Thus, the conductor 205 whose top surface is flat can be formed. Note that the insulator 216 is partly removed by the CMP treatment in some cases. The above is another method for forming the conductor 205.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Next, the insulator 224 is deposited over the insulator 222. The insulator 224 can be deposited by a sputtering method, a CVD method, an MBE method, a PLD method, an ALD method, or the like.

Sequentially, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas atmosphere, an inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at 10 ppm or more, 1% or more, or 10% or more in order to compensate for released oxygen.

In this embodiment, treatment is performed at 400° C. in a nitrogen atmosphere for one hour, and successively another treatment is performed at 400° C. in an oxygen atmosphere for one hour. By the heat treatment, impurities such as water and hydrogen included in the insulator 224 can be removed, for example.

The above heat treatment may be performed after the insulator 222 is deposited. For the heat treatment, the conditions for the above-described heat treatment can be used.

Here, plasma treatment containing oxygen may be performed under reduced pressure so that an excess-oxygen region can be formed in the insulator 224. The plasma treatment containing oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen included in the insulator 224 can be removed by selecting the conditions for the plasma treatment appropriately. In that case, the heat treatment is not necessarily performed.

Here, after aluminum oxide is deposited over the insulator 224 by a sputtering method, for example, the aluminum oxide may be subjected to CMP treatment until the insulator 224 is reached. The CMP treatment can planarize and smooth the surface of the insulator 224. When the CMP treatment is performed on the aluminum oxide placed over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can prevent deterioration of the coverage with an oxide deposited later and a decrease in the yield of the semiconductor device in some cases. The deposition of aluminum oxide over the insulator 224 by a sputtering method is preferred because oxygen can be added to the insulator 224.

Figure 6A:
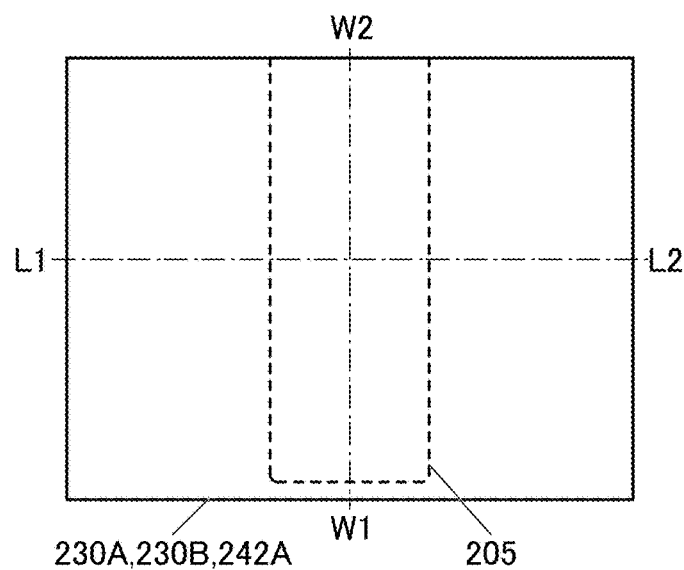
FIG. 6 (A), (B), (C) A top view and cross-sectional views illustrating a method for manufacturing a semiconductor device of one embodiment of the present invention.
Figure 6C:
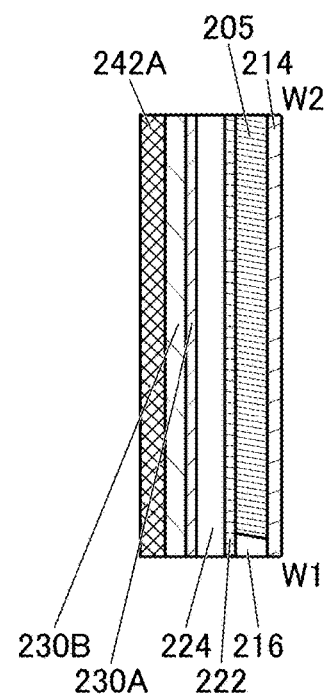
Figure 6B:
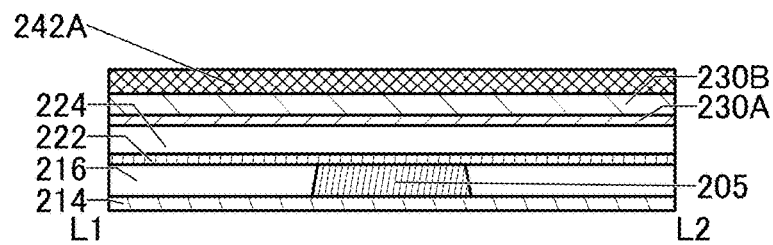
Figure 7A:
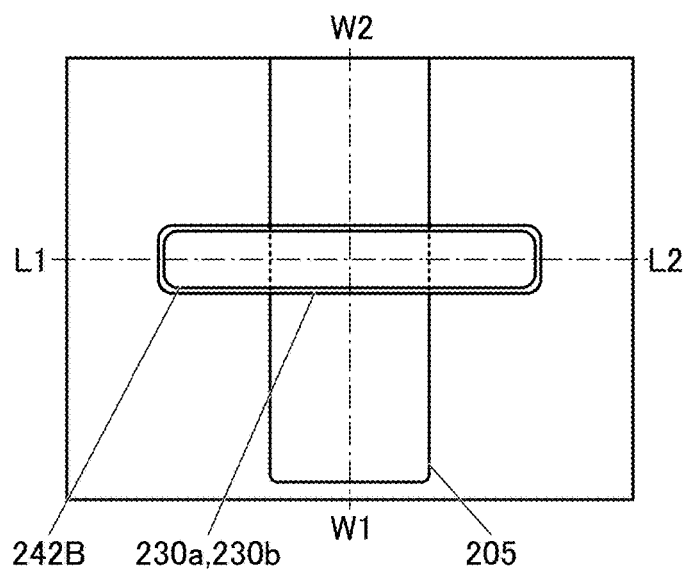
FIG. 7 (A), (B), (C) A top view and cross-sectional views illustrating a method for manufacturing a semiconductor device of one embodiment of the present invention.
Figure 7C:
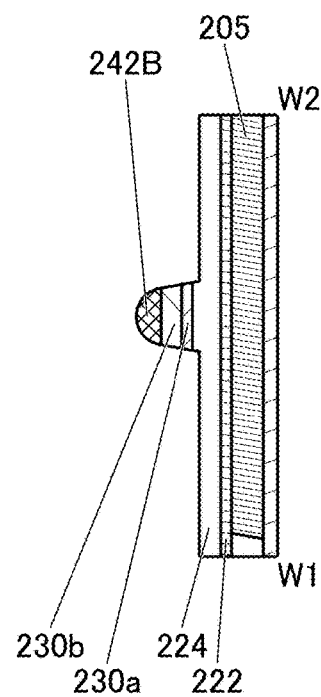
Figure 7B:
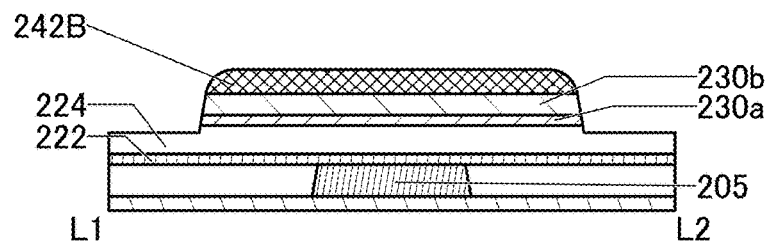

Next, an oxide film 230A to be the oxide 230a and an oxide film 230B to be the oxide 230b are deposited in this order over the insulator 224 (see FIG. 6). Note that the oxide films are preferably deposited successively without exposure to an atmospheric environment. By the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. The amount of excess oxygen in the oxide film to be deposited can be increased by an increase in the proportion of oxygen included in the sputtering gas. In the case where the above oxide films are deposited by a sputtering method, the above In-M-Zn oxide target can be used.

In particular, when the oxide film 230A is deposited, part of oxygen included in the sputtering gas is supplied to the insulator 224 in some cases. Therefore, the proportion of oxygen included in the sputtering gas for the oxide film 230A is preferably 70% or higher, further preferably 80% or higher, still further preferably 100%.

In the case where the oxide film 230B is formed by a sputtering method, when the proportion of oxygen included in the sputtering gas is higher than or equal to 1% and lower than or equal to 30%, preferably higher than or equal to 5% and lower than or equal to 20% during the deposition, an oxygen-deficient oxide semiconductor is formed. In a transistor using an oxygen-deficient oxide semiconductor for its channel formation region, relatively high field-effect mobility can be obtained.

In this embodiment, the oxide film 230A is deposited by a sputtering method using an In—Ga—Zn oxide target with In:Ga:Zn=1:1:0.5 [atomic ratio] (2:2:1 [atomic ratio]) or an In—Ga—Zn oxide target with In:Ga:Zn=1:3:4 [atomic ratio]. The oxide film 230B is deposited by a sputtering method using an In—Ga—Zn oxide target with In:Ga:Zn=4:2:4.1 [atomic ratio]. Note that each of the oxide films is preferably formed to have characteristics required for the oxide 230 by appropriate selection of deposition conditions and an atomic ratio.

Next, heat treatment may be performed. For the heat treatment, the conditions for the above-described heat treatment can be used. Through the heat treatment, impurities such as water and hydrogen in the oxide film 230A and the oxide film 230B can be removed, for example. In this embodiment, treatment is performed at 400° C. in a nitrogen atmosphere for one hour, and successively another treatment is performed at 400° C. in an oxygen atmosphere for one hour.

Next, a conductive film 242A is deposited over the oxide film 230B. The conductive film 242A can be deposited by a sputtering method, a CVD method, an MBE method, a PLD method, an ALD method, or the like (see FIG. 6).

Next, the oxide film 230A, the oxide film 230B, and the conductive film 242A are processed into island shapes to form the oxide 230a, the oxide 230b, and a conductive layer 242B. Note that in the step, the thickness of a region of the insulator 224 which does not overlap with the oxide 230a becomes small in some cases (see FIG. 7).

Here, the oxide 230a, the oxide 230b, and the conductive layer 242B are formed to at least partly overlap with the conductor 205. It is preferable that the side surfaces of the oxide 230a, the oxide 230b, and the conductive layer 242B be substantially perpendicular to a top surface of the insulator 222. When the side surfaces of the oxide 230a, the oxide 230b, and the conductive layer 242B are substantially perpendicular to the top surface of the insulator 222, the plurality of transistors 200 can be provided in a smaller area and at a higher density. Alternatively, a structure may be employed in which an angle formed by the side surfaces of the oxide 230a, the oxide 230b, and the conductive layer 242B and the top surface of the insulator 222 is a small angle. In that case, the angle formed by the side surfaces of the oxide 230a, the oxide 230b, and the conductive layer 242B and the top surface of the insulator 222 is preferably greater than or equal to 60° and less than 70°. With such a shape, coverage with the insulator 254 and the like can be improved in a later step, so that defects such as voids can be reduced.

There is a curved surface between the side surface of the conductive layer 242B and the top surface of the conductive layer 242B. That is, an end portion of the side surface and an end portion of the top surface are preferably curved (hereinafter such a curved shape is also referred to as a rounded shape). The radius of curvature of the curved surface at an end portion of the conductive layer 242B is greater than or equal to 3 nm and less than or equal to 10 nm, preferably greater than or equal to 5 nm and less than or equal to 6 nm, for example. When the end portions are not angular, the coverage with films deposited in a later step can be improved.

Note that for the processing of the oxide film 230A, the oxide film 230B, and the conductive film 242A, a lithography method can be employed. The processing can be performed by a dry etching method or a wet etching method. The processing by a dry etching method is suitable for microfabrication.

Figure 8A:
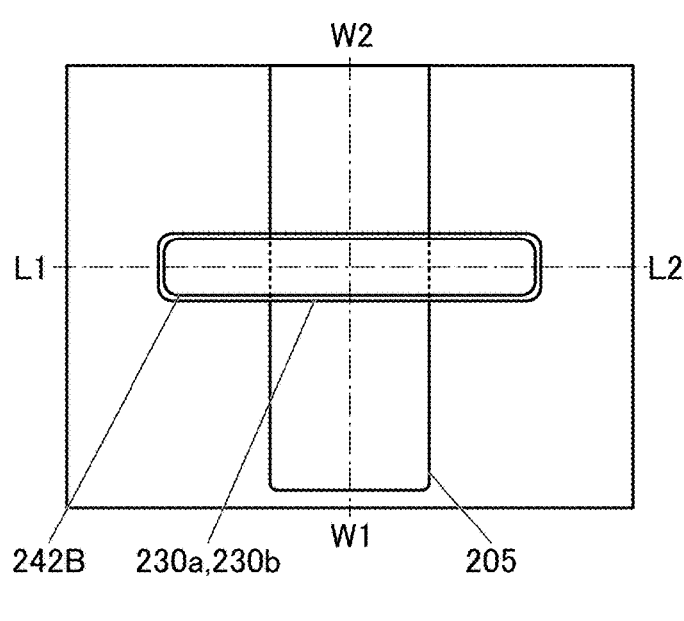
FIG. 8 (A), (B), (C) A top view and cross-sectional views illustrating a method for manufacturing a semiconductor device of one embodiment of the present invention.
Figure 8C:
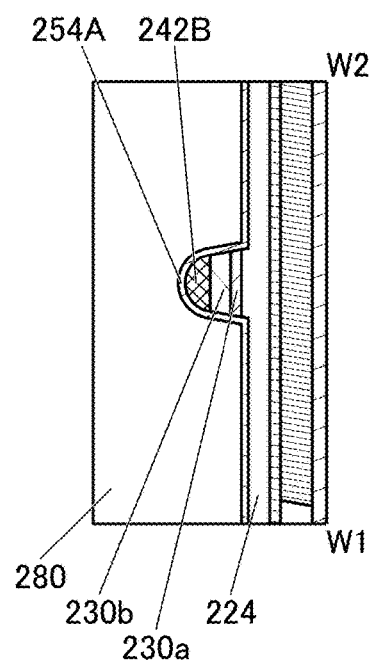
Figure 8B:
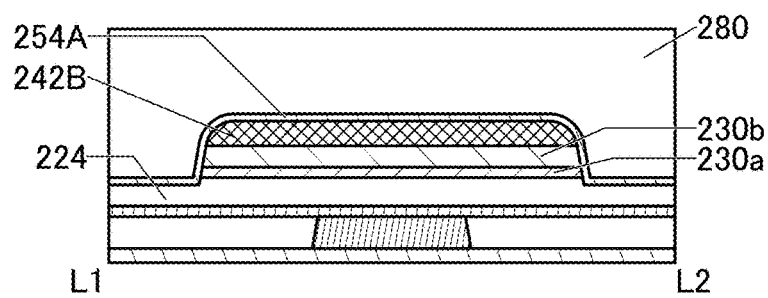
Figure 9A:
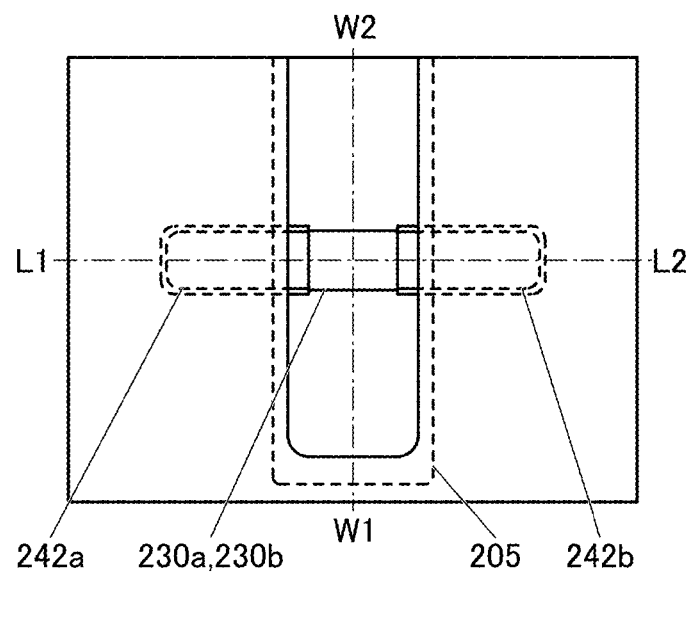
FIG. 9 (A), (B), (C) A top view and cross-sectional views illustrating a method for manufacturing a semiconductor device of one embodiment of the present invention.
Figure 9C:
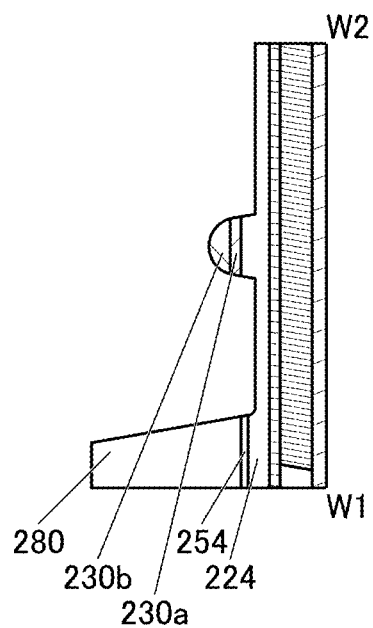
Figure 9B:
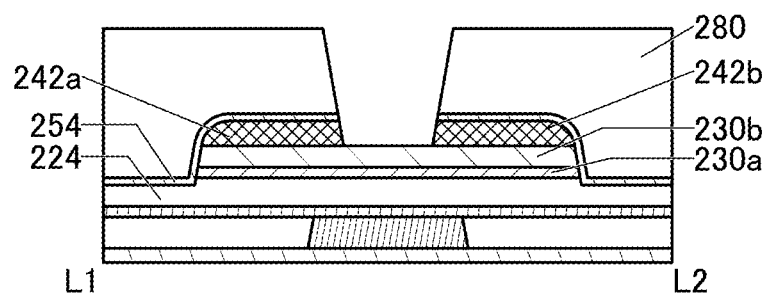
Figure 10A:
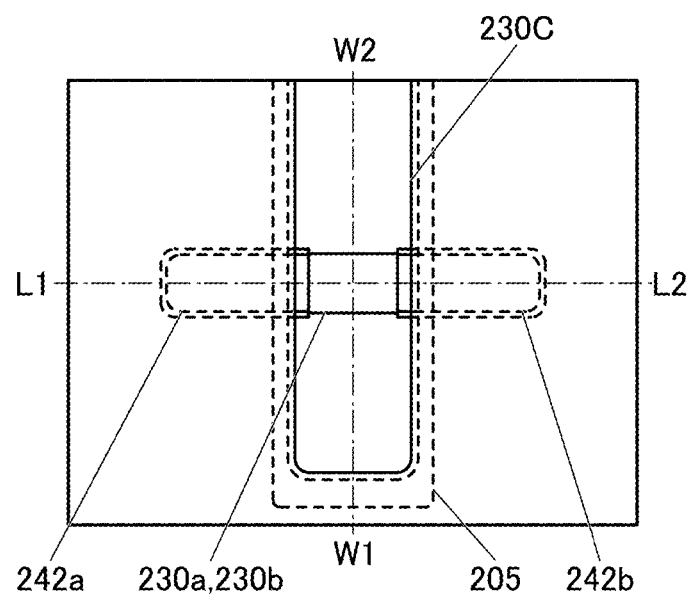
FIG. 10 (A), (B), (C) A top view and cross-sectional views illustrating a method for manufacturing a semiconductor device of one embodiment of the present invention.
Figure 10C:
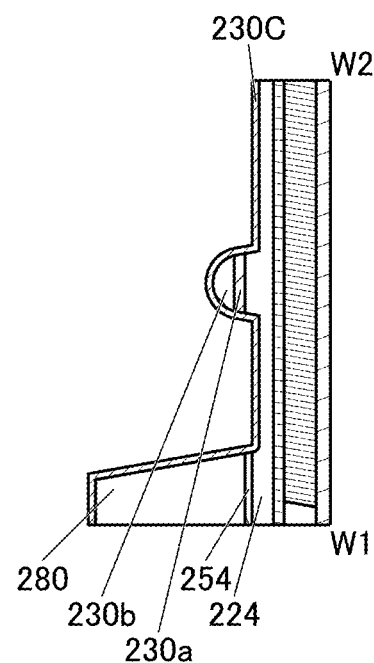
Figure 10B:
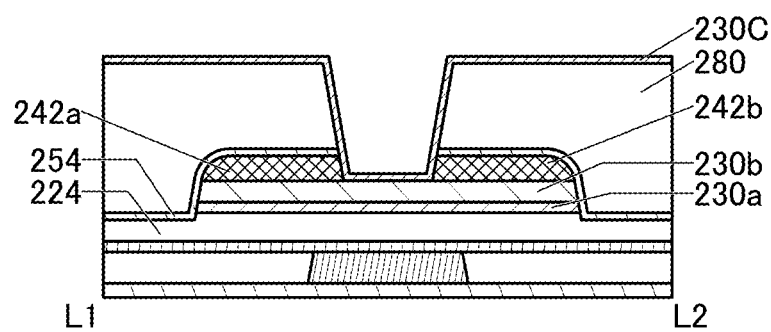
Figure 11A:
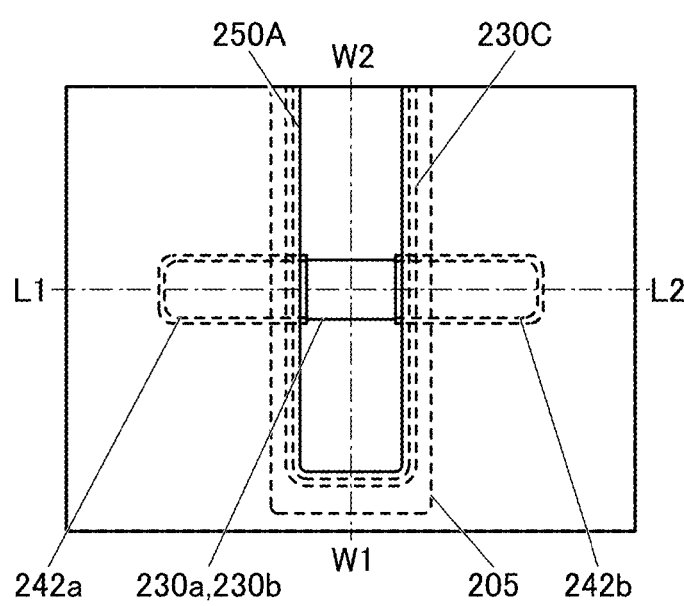
FIG. 11 (A), (B), (C) A top view and cross-sectional views illustrating a method for manufacturing a semiconductor device of one embodiment of the present invention.
Figure 11C:
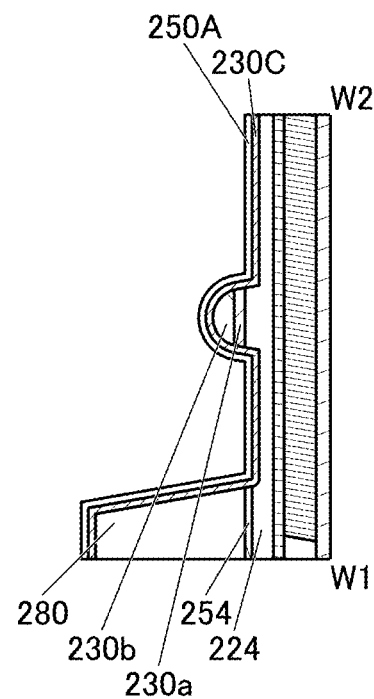
Figure 11B:
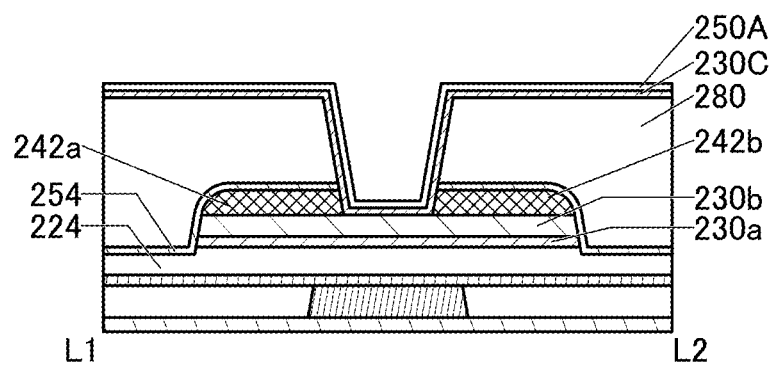
Figure 12A:
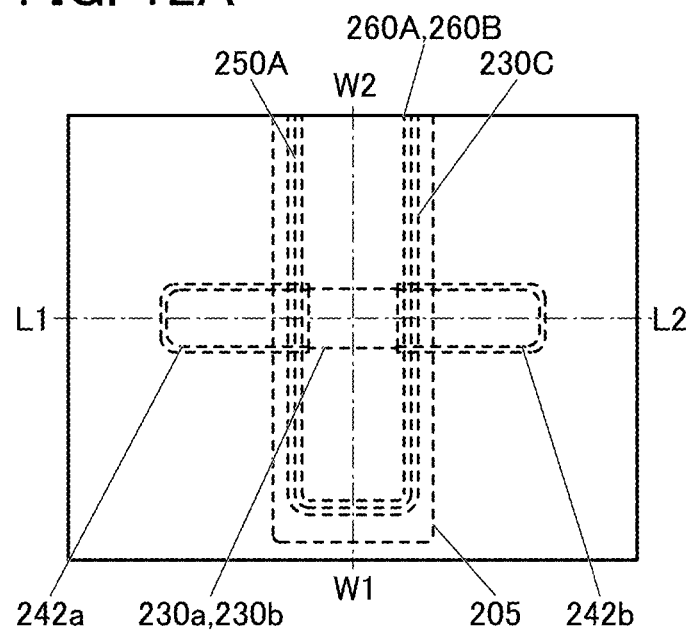
FIG. 12 (A), (B), (C) A top view and cross-sectional views illustrating a method for manufacturing a semiconductor device of one embodiment of the present invention.
Figure 12C:
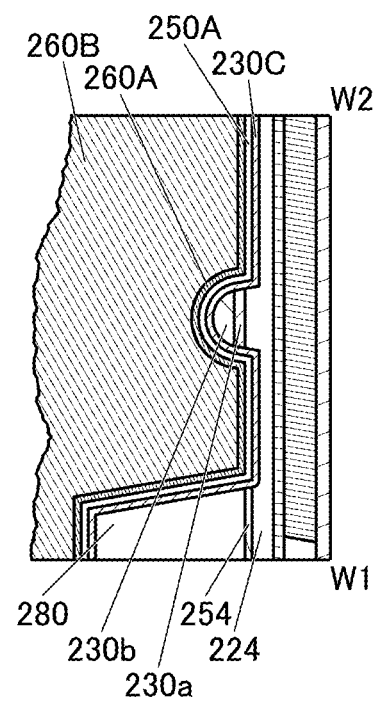
Figure 12B:
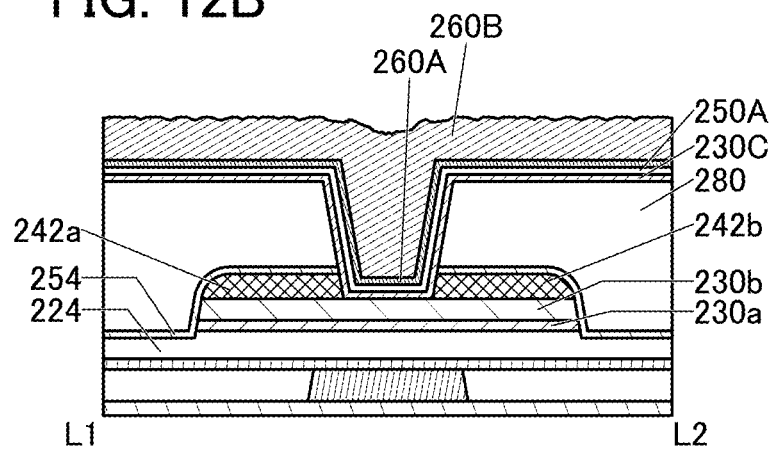

Next, an insulating film 254A is deposited over the insulator 224, the oxide 230a, the oxide 230b, and the conductive layer 242B (see FIG. 8).

As the insulating film 254A, an insulating film having a function of inhibiting passage of oxygen is preferably used. For example, an aluminum oxide film is preferably deposited by a sputtering method. When an aluminum oxide film is deposited by a sputtering method using a gas containing oxygen, oxygen can be injected into the insulator 224. That is, the insulator 224 can contain excess oxygen.

Next, an insulating film to be the insulator 280 is deposited over the insulating film 254A. The insulating film to be the insulator 280 can be deposited by a sputtering method, a CVD method, an MBE method, a PLD method, an ALD method, or the like. Next, the insulating film to be the insulator 280 is subjected to CMP treatment, so that the insulator 280 having a flat top surface is formed (see FIG. 8).

Then, part of the insulator 280, part of the insulating film 254A, and part of the conductive layer 242B are processed to form an opening reaching the oxide 230b. The opening is preferably formed to overlap with the conductor 205. The conductor 242a, the conductor 242b, and the insulator 254 are formed by the opening (see FIG. 9).

Part of the insulator 280, part of the insulating film 254A, and part of the conductive layer 242B may be processed under different conditions. For example, part of the insulator 280 may be processed by a dry etching method, part of the insulating film 254A may be processed by a wet etching method, and part of the conductive layer 242B may be processed by a dry etching method.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the above impurities and the like, cleaning is performed. Examples of the cleaning method include wet cleaning using a cleaning solution, plasma treatment using plasma, and cleaning by heat treatment, and any of these cleanings may be performed in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed.

Next, heat treatment may be performed. Heat treatment may be performed under reduced pressure, and an oxide film 230C may be successively deposited without exposure to the air. The treatment can remove moisture and hydrogen adsorbed onto the surface onto the surface of the oxide 230b and the like, and further can reduce the moisture concentration and the hydrogen concentration of the oxide 230a and the oxide 230b. The heat treatment is preferably performed at a temperature higher than or equal to 100° C. and lower than or equal to 400° C. In this embodiment, the heat treatment is performed at 200° C. (see FIG. 10).

The oxide film 230C can be deposited by a sputtering method, a CVD method, an MBE method, a PLD method, an ALD method, or the like. An oxide film to be the oxide film 230C is deposited by a method similar to that for the oxide film 230A or the oxide film 230B in accordance with characteristics required for the oxide film 230C. In this embodiment, the oxide film 230C is deposited by a sputtering method using an In—Ga—Zn oxide target with In:Ga:Zn=1:3:4 [atomic ratio] or 4:2:4.1 [atomic ratio].

In particular, when the oxide film 230C is deposited, part of oxygen included in the sputtering gas is supplied to the oxide 230a and the oxide 230b in some cases. Therefore, the proportion of oxygen included in the sputtering gas for the oxide film 230C is preferably 70% or higher, further preferably 80% or higher, and still further preferably 100%.

Next, heat treatment may be performed. Heat treatment may be performed under reduced pressure, and the insulating film 250A may be successively deposited without exposure to the air. The treatment can remove moisture and hydrogen adsorbed onto the surface onto the surface of the oxide film 230C and the like, and further can reduce the moisture concentration and the hydrogen concentration of the oxide 230a, the oxide 230b, and the oxide film 230C. The heat treatment is preferably performed at a temperature higher than or equal to 100° C. and lower than or equal to 400° C. (see FIG. 11).

The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulating film having few impurities can be deposited.

Next, a conductive film 260A and a conductive film 260B are deposited. The conductive film 260A and the conductive film 260B can be deposited by a sputtering method, a CVD method, an MBE method, a PLD method, an ALD method, or the like. For example, a CVD method is preferably used. In this embodiment, the conductive film 260A is deposited by an ALD method, and the conductive film 260B is deposited by a CVD method (see FIG. 12).

Figure 13A:
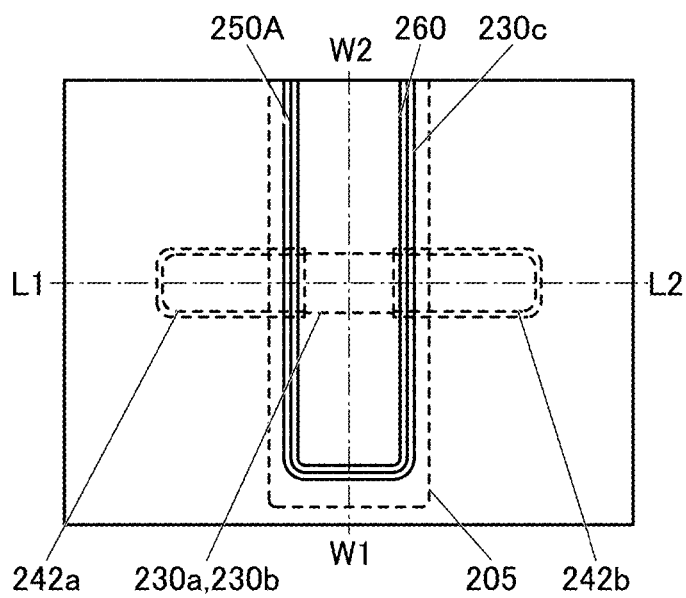
FIG. 13 (A), (B), (C) A top view and cross-sectional views illustrating a method for manufacturing a semiconductor device of one embodiment of the present invention.
Figure 13C:
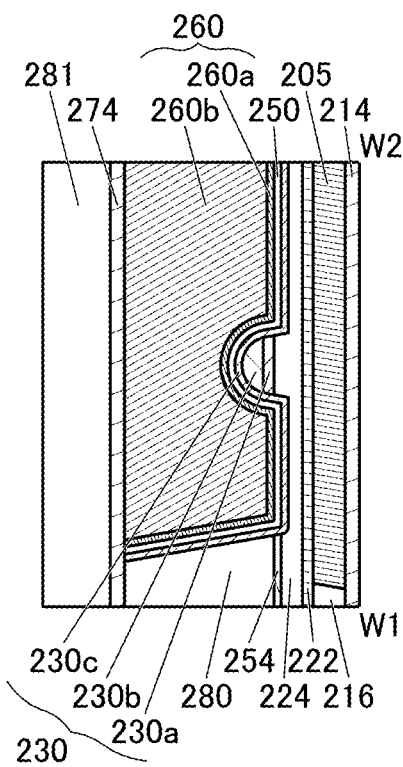
Figure 13B:
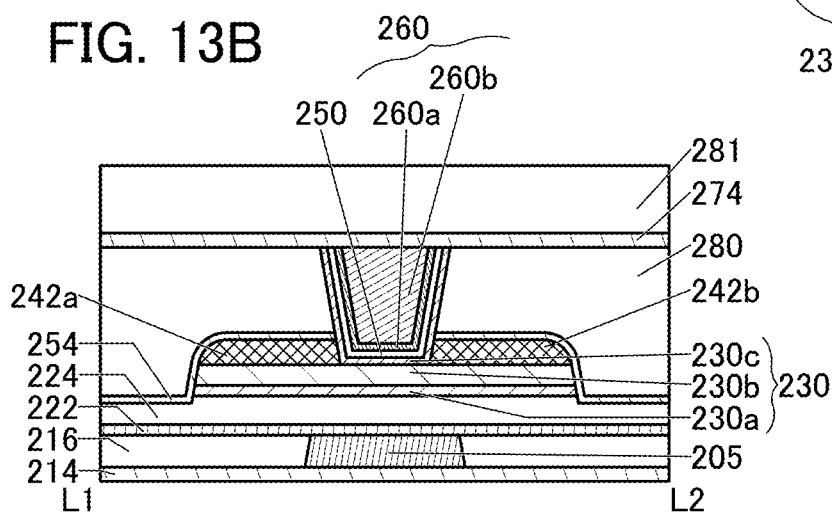

Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIG. 13). Accordingly, the oxide 230c is positioned to cover the inner wall (the side wall and the bottom surface) of the opening that reaches the oxide 230b. The insulator 250 is positioned to cover the inner wall of the opening with the oxide 230c placed therebetween. The conductor 260 is positioned to fill the opening with the oxide 230c and the insulator 250 placed therebetween.

Next, heat treatment may be performed. In this embodiment, the treatment is performed at 400° C. in a nitrogen atmosphere for one hour. The heat treatment can reduce the moisture concentration and the hydrogen concentration in the insulator 250 and the insulator 280.

Next, the insulator 274 may be formed over the insulator 280. The insulator 274 can be deposited by a sputtering method, a CVD method, an MBE method, a PLD method, an ALD method, or the like. An aluminum oxide film is preferably deposited as the insulator 274 by a sputtering method, for example. An aluminum oxide film deposited by a sputtering method sometimes extracts hydrogen from a structure body over which the film is formed. Therefore, with an aluminum oxide film deposited by a sputtering method, hydrogen included in the insulator 280 can be inhibited from diffusing into the insulator 250 and the oxide 230 in some cases (see FIG. 13).

Next, heat treatment may be performed. In this embodiment, the treatment is performed at 400° C. in a nitrogen atmosphere for one hour. By the heat treatment, oxygen added by the deposition of the insulator 274 can be injected into the insulator 250 and the insulator 280.

Next, the insulator 281 may be deposited over the insulator 274. The insulator 281 can be deposited by a sputtering method, a CVD method, an MBE method, a PLD method, an ALD method, or the like (see FIG. 13).

Then, an opening that reaches the conductor 242a or the conductor 242b is formed in the insulator 254, the insulator 280, the insulator 274, and the insulator 281. The opening is formed by a lithography method.

Next, an insulating film to be the insulator 241 is deposited and the insulating film is subjected to anisotropic etching, so that the insulator 241 is formed. The insulating film can be deposited by a sputtering method, a CVD method, an MBE method, a PLD method, an ALD method, or the like. As the insulating film, an insulating film having a function of inhibiting passage of oxygen is preferably used. For example, an aluminum oxide film is preferably deposited by an ALD method. For the anisotropic etching, a dry etching method or the like is performed, for example. When the side wall portions of the openings have such a structure, passage of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240a and the conductor 240b is deposited. The conductive film to be the conductor 240a and the conductor 240b desirably has a stacked-layer structure which includes a conductor having a function of inhibiting passage of impurities such as water and hydrogen. For example, a stack of tantalum nitride, titanium nitride, or the like and tungsten, molybdenum, copper, or the like can be employed. The conductive film to be the conductor 240a and the conductor 240b can be deposited by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 1). Note that the insulator 281 is partly removed by the CMP treatment in some cases.

Through the above process, the semiconductor device including the transistor 200 illustrated in FIG. 1 can be fabricated. As illustrated in FIG. 6 to FIG. 13, with the use of the method for manufacturing the semiconductor device described in this embodiment, the transistor 200 can be fabricated.

According to one embodiment of the present invention, a semiconductor device having a high on-state current can be provided. According to one embodiment of the present invention, a semiconductor device having excellent frequency characteristics can be provided. According to one embodiment of the present invention, a semiconductor device having favorable reliability can be provided. According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device having a low off-state current can be provided. According to one embodiment of the present invention, a semiconductor device having reduced power consumption can be provided. According to one embodiment of the present invention, a semiconductor device having high productivity can be provided.

The structures, methods, and the like described above in this embodiment can be used in combination as appropriate with the structures, methods, and the like described in the other embodiments and the example.

Embodiment 2

In this embodiment, one embodiment of a semiconductor device will be described with reference to FIG. 14 and FIG. 15.

[Memory Device 1]

Figure 14:
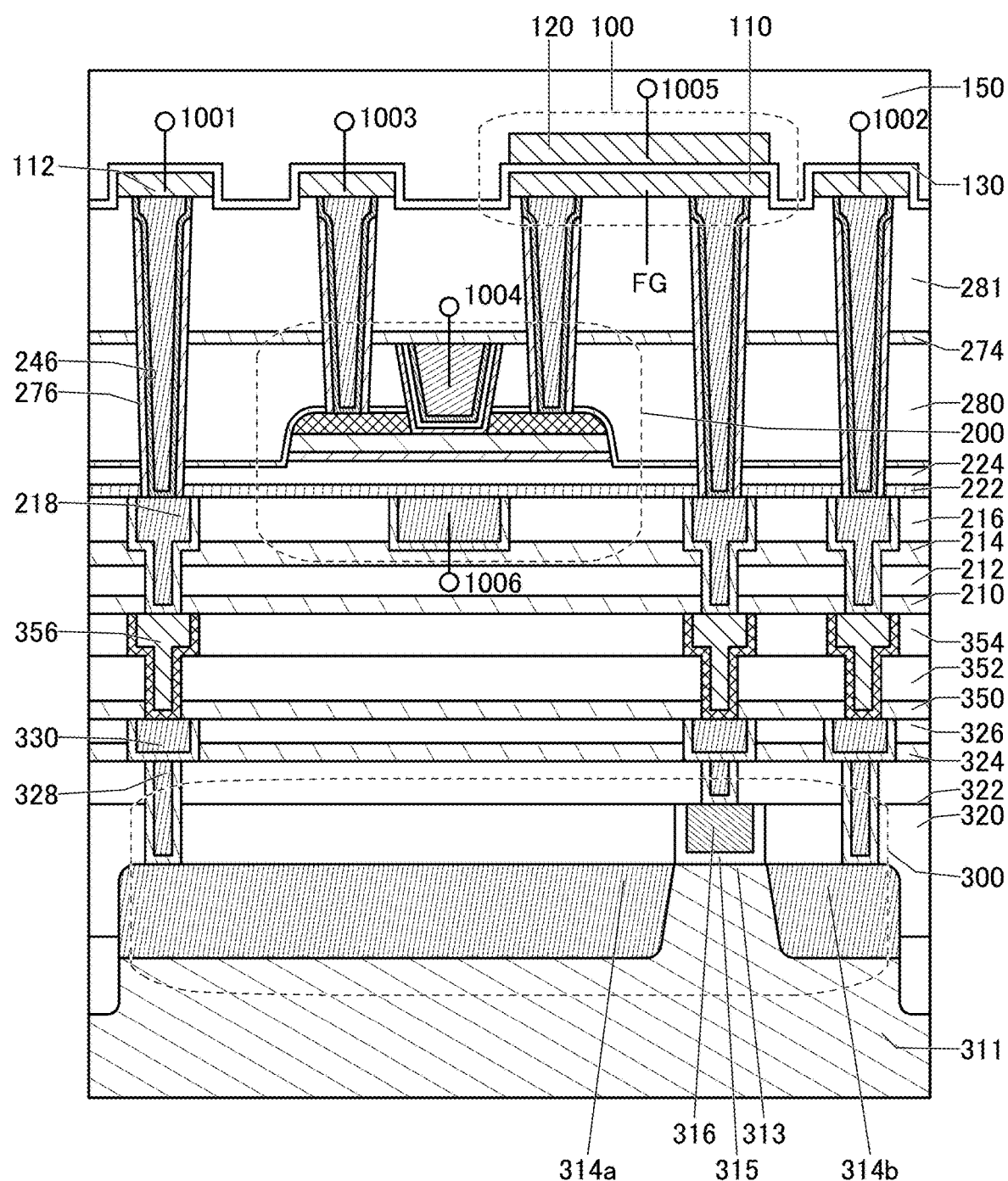
FIG. 14 A cross-sectional view illustrating a structure of a memory device of one embodiment of the present invention.

FIG. 14 illustrates an example of a semiconductor device (memory device) using a capacitor which is one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor whose channel is formed in a semiconductor layer including an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 14, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

The memory devices illustrated in FIG. 14 can form a memory cell array when arranged in a matrix.

<Transistor 300>

The transistor 300 is provided over a substrate 311 and includes a conductor 316 functioning as a gate electrode, an insulator 315 functioning as a gate insulator, a semiconductor region 313 formed of part of the substrate 311, and a low-resistance region 314a and a low-resistance region 314b functioning as a source region and a drain region. The transistor 300 may be a p-channel type or an n-channel type.

In the transistor 300 illustrated in FIG. 14, the semiconductor region 313 (part of the substrate 311) in which a channel is formed has a convex shape. Furthermore, the conductor 316 is provided to cover a side surface and a top surface of the semiconductor region 313 with the insulator 315 therebetween. Note that a material adjusting the work function may be used for the conductor 316. The transistor 300 having such a structure is also referred to as a FIN transistor because a convex portion of a semiconductor substrate is utilized. An insulator functioning as a mask for forming the convex portion may be included in contact with an upper portion of the convex portion. Although the case where the convex portion is formed by processing part of the semiconductor substrate is described here, a semiconductor film having a convex shape may be formed by processing an SOI substrate.

Note that the transistor 300 illustrated in FIG. 14 is an example and the structure is not limited thereto; an appropriate transistor is used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 provided over the conductor 246 can be formed at the same time. Note that the conductor 112 functions as a plug or a wiring that is electrically connected to the capacitor 100, the transistor 200, or the transistor 300.

Although the conductor 112 and the conductor 110 having a single-layer structure are illustrated in FIG. 14, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

The insulator 130 can be provided to have stacked layers or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, for the insulator 130, a stacked-layer structure using a material with high dielectric strength such as silicon oxynitride and a high dielectric constant (high-k) material is preferably used. In the capacitor 100 having such a structure, a sufficient capacitance can be ensured owing to the high dielectric constant (high-k) insulator, and the dielectric strength can be increased owing to the insulator with high dielectric strength, so that the electrostatic breakdown of the capacitor 100 can be inhibited.

As the insulator of a high dielectric constant (high-k) material (a material having a high dielectric constant), gallium oxide, hafnium oxide, zirconium oxide, an oxide including aluminum and hafnium, an oxynitride including aluminum and hafnium, an oxide including silicon and hafnium, an oxynitride including silicon and hafnium, a nitride including silicon and hafnium, or the like can be given.

As the material having a high dielectric strength (a material having a low dielectric constant), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layers>

Wiring layers provided with an interlayer film, a wiring, a plug, and the like may be provided between the structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulator functioning as an interlayer film may function as a planarization film that covers a roughness thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 14, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor (conductor 205) included in the transistor 200, and the like are embedded in the insulator 210, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

As an insulator that can be used for an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low dielectric constant is used for the insulator functioning as an interlayer film, the parasitic capacitance between wirings can be reduced. Accordingly, a material is preferably selected in accordance with the function of an insulator.

For example, for the insulator 150, the insulator 212, the insulator 352, the insulator 354, or the like, an insulator having a low dielectric constant is preferably used. For example, the insulator preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Since silicon oxide and silicon oxynitride have thermal stability, a combination of silicon oxide or silicon oxynitride with a resin allows the stacked-layer structure to be thermally stable and have a low dielectric constant.

Examples of the resin include polyester, polyolefin, polyamide (e.g., nylon and aramid), polyimide, polycarbonate, and acrylic.

When the transistor using an oxide semiconductor is surrounded by an insulator having a function of inhibiting passage of oxygen and impurities such as hydrogen, the electrical characteristics of the transistor can be stabilized. Thus, the insulator having a function of inhibiting passage of oxygen and impurities such as hydrogen can be used for the insulator 210, the insulator 350, and the like.

The insulator having a function of inhibiting passage of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductors that can be used for wirings or plugs, a material including one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity typified by polycrystalline silicon including an impurity element such as phosphorus, or silicide such as nickel silicide may be used.

For example, for the conductor 328, the conductor 330, the conductor 356, the conductor 218, the conductor 112, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<<Wirings or Plugs in Layer Provided with Oxide Semiconductor>>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and the conductor provided in the insulator including the excess-oxygen region.

For example, an insulator 276 is preferably provided between the insulator 224 including excess oxygen and the conductor 246 in FIG. 14. Since the insulator 276 is provided in contact with the insulator 222 and the insulator 274, the insulator 224 and the transistor 200 can be sealed by the insulators having a barrier property. It is also preferable that the insulator 276 be in contact with part of the insulator 280. When the insulator 276 extends to the insulator 280, diffusion of oxygen and impurities can be further inhibited.

That is, the insulator 276 can inhibit excess oxygen included in the insulator 224 from being absorbed by the conductor 246. In addition, the insulator 276 can inhibit diffusion of hydrogen, which is an impurity, into the transistor 200 through the conductor 246.

The insulator 276 is preferably formed using an insulating material having a function of inhibiting diffusion of oxygen and impurities such as water and hydrogen. For example, aluminum oxide, hafnium oxide, or the like is preferably used. Other than that, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like can be used, for example.

The above is the description of the structure example. With the use of the structure, a semiconductor device using a transistor including an oxide semiconductor can have a small variation in electrical characteristics and higher reliability. A transistor including an oxide semiconductor with a high on-state current can be provided. A transistor including an oxide semiconductor with low off-state current can be provided. A semiconductor device having reduced power consumption can be provided.

[Memory Device 2]

Figure 15:
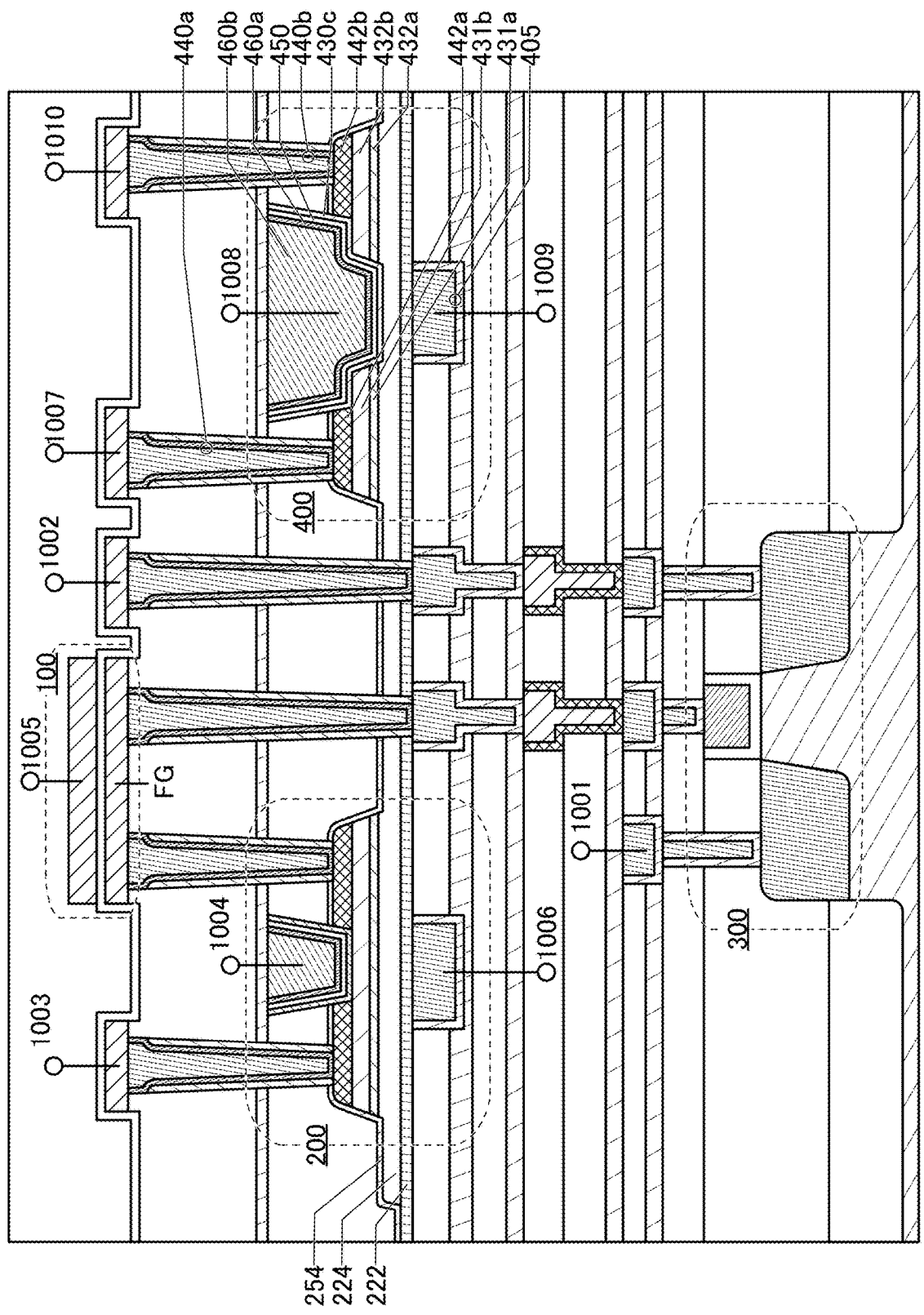
FIG. 15 A cross-sectional view illustrating a structure of a memory device of one embodiment of the present invention.

FIG. 15 illustrates an example of a memory device using the semiconductor device which is one embodiment of the present invention. The memory device illustrated in FIG. 15 includes a transistor 400 in addition to the semiconductor device including the transistor 200, the transistor 300, and the capacitor 100 illustrated in FIG. 14.

The transistor 400 can control a second gate voltage of the transistor 200. For example, a first gate and a second gate of the transistor 400 are diode-connected to a source, and the source of the transistor 400 is connected to the second gate of the transistor 200. When a negative potential of the second gate of the transistor 200 is held in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

In FIG. 15, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the gate of the transistor 200, and the wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. The wiring 1006, the wiring 1007, the wiring 1008, and the wiring 1009 are electrically connected to each other.

When the memory devices illustrated in FIG. 15 are arranged in a matrix like the memory devices illustrated in FIG. 14, a memory cell array can be formed. Note that one transistor 400 can control second gate voltages of a plurality of transistors 200. For this reason, the number of transistors 400 is preferably smaller than the number of transistors 200.

<Transistor 400>

The transistor 400 and the transistors 200 are formed in the same layer and thus can be fabricated in parallel. The transistor 400 includes a conductor 460 (a conductor 460a and a conductor 460b) functioning as a first gate electrode; a conductor 405 functioning as a second gate electrode; the insulator 222, the insulator 224, and an insulator 450 functioning as a gate insulating layer; an oxide 430c including a region where a channel is formed; a conductor 442a, an oxide 431a, and an oxide 431b functioning as one of a source and a drain; a conductor 442b, an oxide 432a, and an oxide 432b functioning as the other of the source and the drain; and a conductor 440 (a conductor 440a and a conductor 440b).

In the transistor 400, the conductor 405 is formed in the same layer as the conductor 205. The oxide 431a and the oxide 432a are formed in the same layer as the oxide 230a, and the oxide 431b and the oxide 432b are formed in the same layer as the oxide 230b. The conductor 442 is formed in the same layer as the conductor 242. The oxide 430c is formed in the same layer as the oxide 230c. The insulator 450 is formed in the same layer as the insulator 250. The conductor 460 is formed in the same layer as the conductor 260.

Note that the structure bodies in the same layer can be formed at the same time. For example, the oxide 430c can be formed by processing the oxide film to be the oxide 230c.

In the oxide 430c functioning as an active layer of the transistor 400, oxygen vacancies and impurities such as water and hydrogen are reduced, as in the oxide 230c or the like. Accordingly, the threshold voltage of the transistor 400 can be further increased, an off-state current can be reduced, and the drain current when the second gate voltage and the first gate voltage are 0 V can be extremely low.

<<D Icing Line>>

Here, a dicing line (referred to as a scribe line, a dividing line, or a cutting line in some cases) which is provided when a large-sized substrate is divided into semiconductor elements so that a plurality of semiconductor devices are each formed in a chip form is described below. Examples of a dividing method include the case where a groove (a dicing line) for separating the semiconductor elements is formed on the substrate, and then the substrate is cut along the dicing line to divide (split) it into a plurality of semiconductor devices.

Here, for example, as illustrated in FIG. 15, it is preferable that a region in which the insulator 254 and the insulator 222 are in contact with each other be the dicing line. That is, an opening is provided in the insulator 224 in the vicinity of the region to be the dicing line that is provided in an outer edge of the transistor 400 and the memory cell including a plurality of transistors 200. The insulator 254 is provided to cover the side surface of the insulator 224.

That is, in the opening provided in the insulator 224, the insulator 222 is in contact with the insulator 254. For example, the insulator 222 and the insulator 254 may be formed using the same material and the same method. When the insulator 222 and the insulator 254 are formed using the same material and the same method, the adhesion therebetween can be increased. For example, aluminum oxide is preferably used.

With such a structure, the insulator 224, the transistor 200, and the transistor 400 can be enclosed with the insulator 222 and the insulator 254. Since the insulator 222 and the insulator 254 have a function of inhibiting diffusion of oxygen, hydrogen, and water, even when the substrate is divided into circuit regions each of which is provided with the semiconductor elements in this embodiment to form a plurality of chips, the mixing and diffusion of impurities such as water and hydrogen from the direction of a side surface of the divided substrate to the transistor 200 or the transistor 400 can be inhibited.

In the structure, excess oxygen in the insulator 224 can be inhibited from diffusing into the outside of the insulator 254 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, the transistor 200 or the transistor 400 can have a small variation in the electrical characteristics and higher reliability.

This embodiment can be implemented in an appropriate combination with the structures described in the other embodiments, the example, and the like.

Embodiment 3

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), will be described with reference to FIG. 16 and FIG. 17. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 16A:
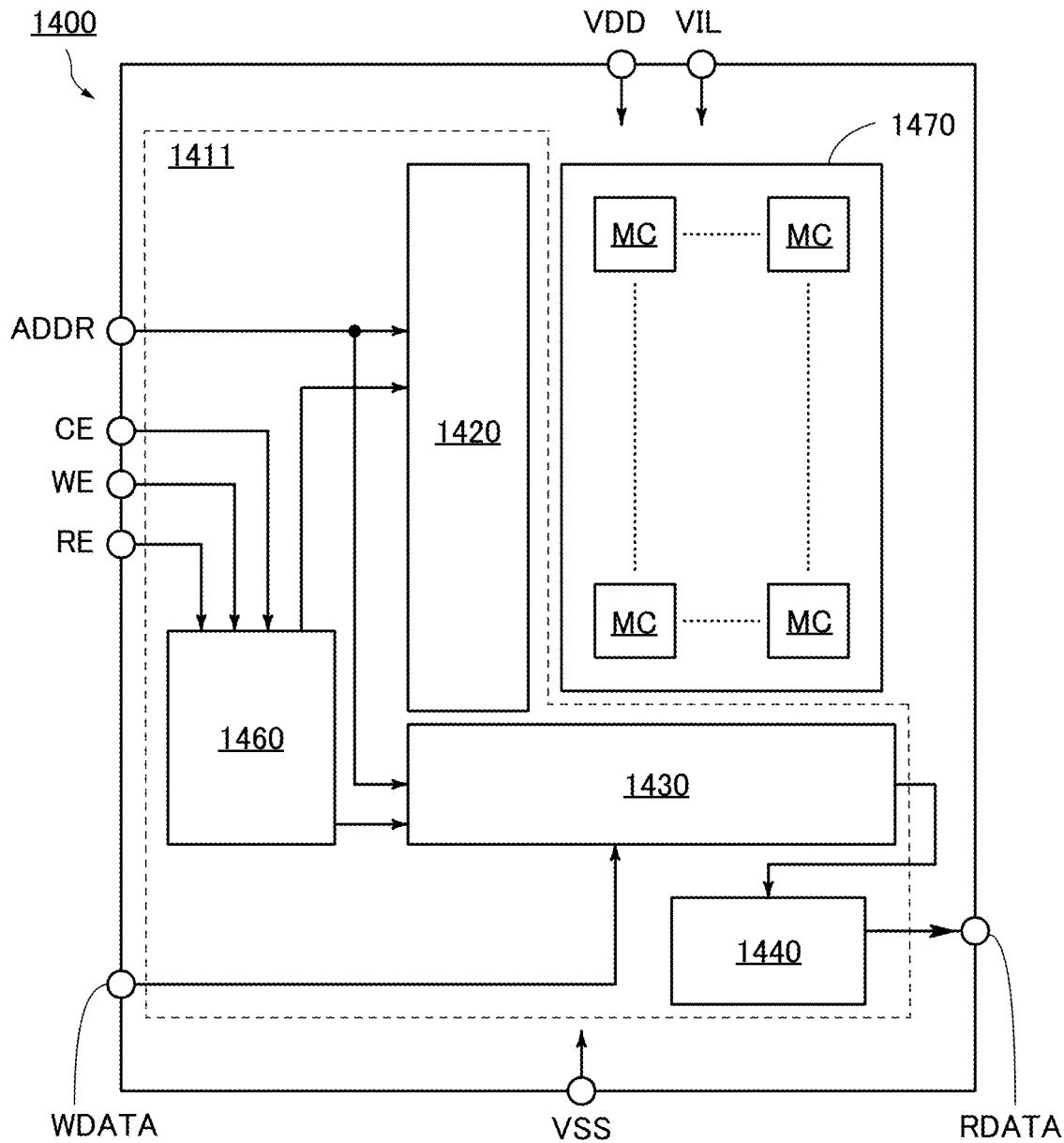
FIG. 16 (A), (B) A block diagram and a perspective view illustrating a structure example of a memory device of one embodiment of the present invention.

FIG. 16(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VS S), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read-out enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 16B:
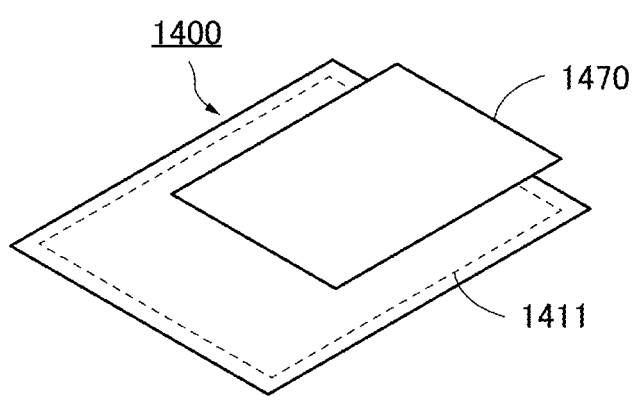

Note that FIG. 16(A) illustrates an example in which the peripheral circuit 1411 and the memory cell array 1470 are formed on the same plane; however, this embodiment is not limited thereto. For example, as illustrated in FIG. 16(B), the memory cell array 1470 may be provided to overlap part of the peripheral circuit 1411. For example, the sense amplifier may be provided below the memory cell array 1470 so that they overlap with each other.

FIG. 17 illustrates structure examples of a memory cell applicable to the memory cell MC.

[DOSRAM]

Figure 17A:
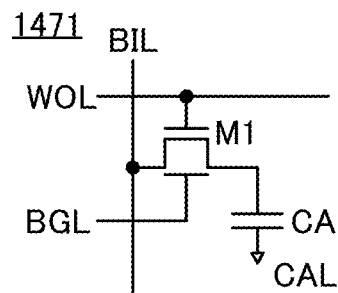
FIG. 17 (A), (B), (C), (D), (E), (F), (G), (H) Circuit diagrams each illustrating a structure example of a memory device of one embodiment of the present invention.
Figure 17B:
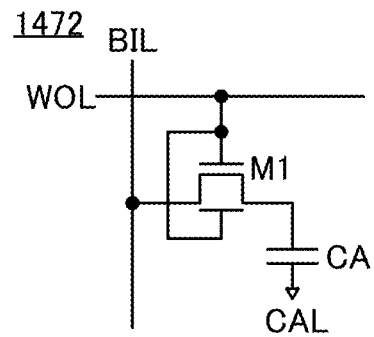
Figure 17C:
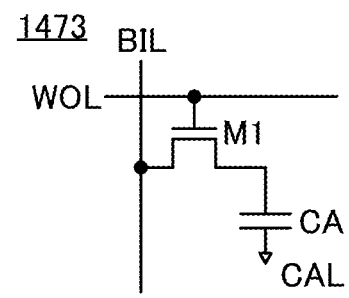
Figure 17D:
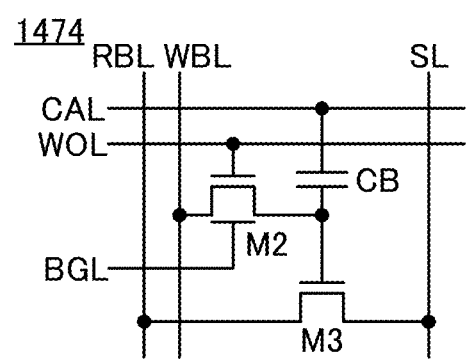
Figure 17E:
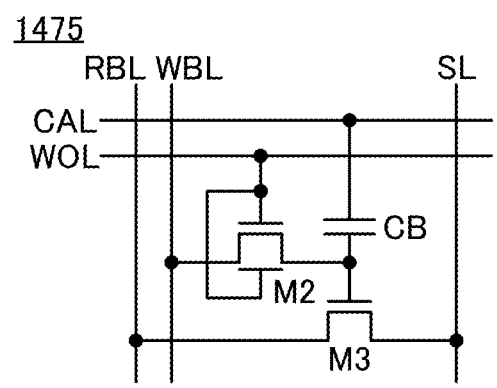
Figure 17F:
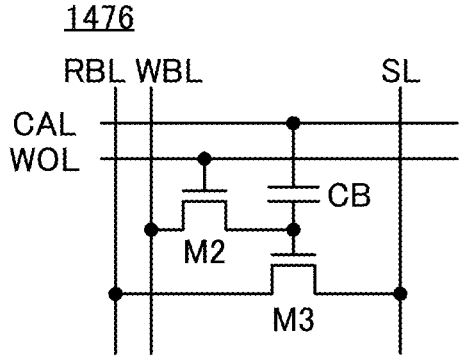
Figure 17G:
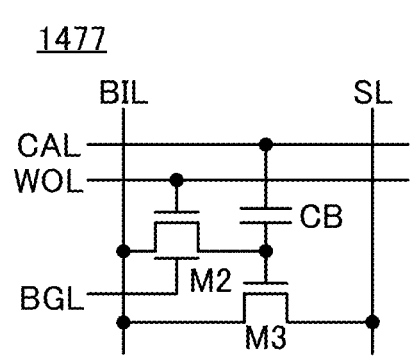

FIGS. 17(A) to 17(C) each illustrate a circuit structure example of a memory cell of a DRAM. In this specification and the like, a DRAM using a memory cell including one OS transistor and one capacitor is referred to as DOSRAM in some cases. A memory cell 1471 illustrated in FIG. 17(A) includes a transistor M1 and a capacitor CA. Note that the transistor M1 includes a gate (also referred to as a top gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and the circuit structure can be changed. For example, as in a memory cell 1472 illustrated in FIG. 17(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 17(C).

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 17(D) to 17(G) each illustrate a circuit structure example of a gain-cell memory cell including two transistors and one capacitor. A memory cell 1474 illustrated in FIG. 17(D) includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By application of a given potential to the wiring BGL, the threshold voltage of the transistor M2 can be increased or decreased.

The memory cell MC is not limited to the memory cell 1474, and the circuit structure can be changed as appropriate. For example, as in a memory cell 1475 illustrated in FIG. 17(E), the back gate of the transistor M2 may be connected not to the wiring BGL but to the wiring WOL in the memory cell MC. Alternatively, for example, the memory cell MC may be a memory cell including a single-gate transistor, that is, the transistor M2 not including a back gate, as in a memory cell 1476 illustrated in FIG. 17(F). Alternatively, for example, in the memory cell MC, the wiring WBL and the wiring RBL may be combined into one wiring BIL, as in a memory cell 1477 illustrated in FIG. 17(G).

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, with the use of the transistor M2, written data can be retained for a long time, and thus the frequency of the refresh operation for the memory cell can be decreased. In addition, refresh operation of the memory cell can be unnecessary. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistor M2 and the transistor M3, the circuit of the memory cell array 1470 can be formed using only n-channel transistors.

Figure 17H:
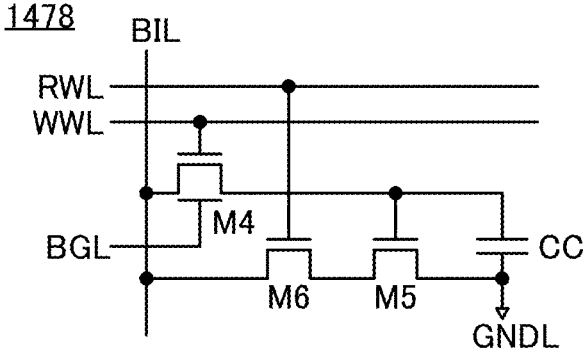

FIG. 17(H) illustrates an example of a gain-cell memory cell including three transistors and one capacitor. A memory cell 1478 illustrated in FIG. 17(H) includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 may not include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, removed, or added as needed.

The structure described in this embodiment can be used in an appropriate combination with the structures described in the other embodiments, the example, and the like.

Embodiment 4

In this embodiment, an example of a chip 1200 on which the semiconductor device of the present invention is mounted will be described with reference to FIG. 18. A plurality of circuits (systems) are mounted on the chip 1200. The technique for integrating a plurality of circuits (systems) on one chip is referred to as system on chip (SoC) in some cases.

Figure 18A:
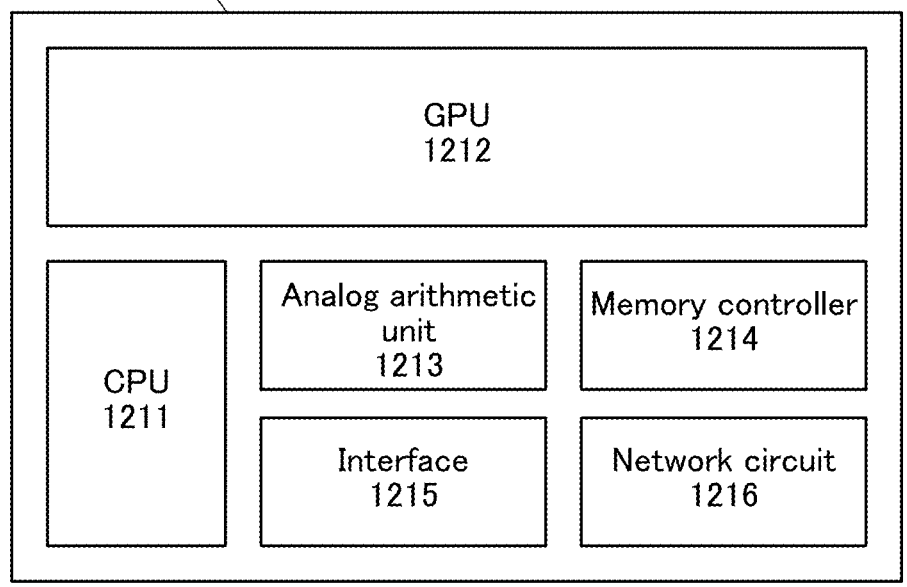
FIG. 18 (A), (B) Schematic views of a semiconductor device of one embodiment of the present invention.

As illustrated in FIG. 18(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 18B:
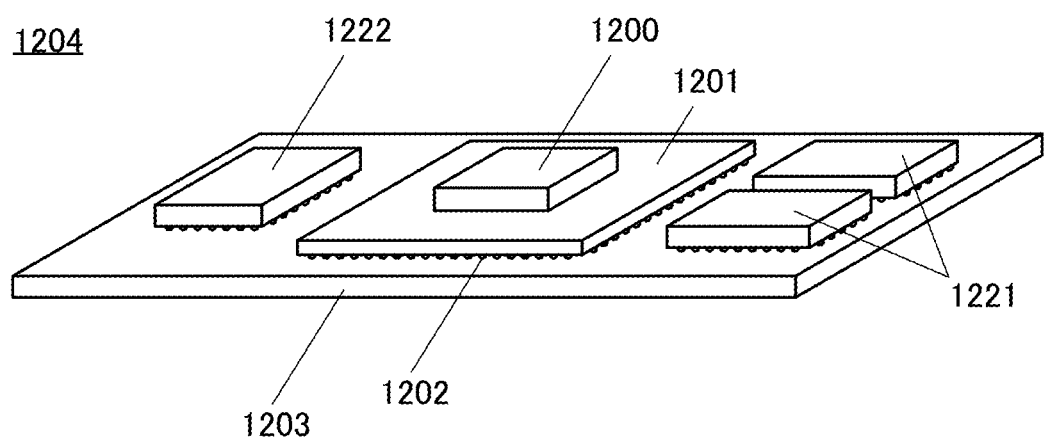

A bump (not illustrated) is provided on the chip 1200, and as illustrated in FIG. 18(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement an arithmetic operation such as a deep neural network (DNN), a convolutional neural network (CNN), a recurrent neural network (RNN), an autoencorder, a deep Boltzmann machine (DBM), or a deep belief network (DBN); thus, the chip 1200 can be used as an AI chip or the GPU module 1204 can be used as an AI system module.

The structure described in this embodiment can be used in an appropriate combination with the structures described in the other embodiments and the example.

Embodiment 5

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 19 schematically illustrates some structure examples of removable memory devices. The semiconductor device described in the above embodiment is processed into a packaged memory chip and used in a variety of storage devices and removable memories, for example.

Figure 19A:
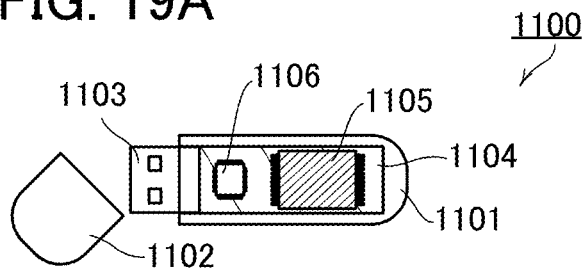
FIG. 19 (A), (B), (C), (D), (E) Schematic views of memory devices of embodiment of the present invention.

FIG. 19(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like.

Figures 19B, 19C:
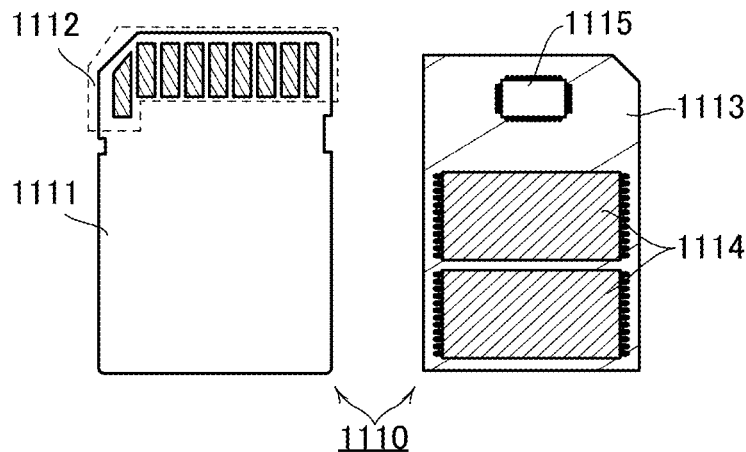

FIG. 19(B) is a schematic external view of an SD card, and FIG. 19(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

Figures 19D, 19E:
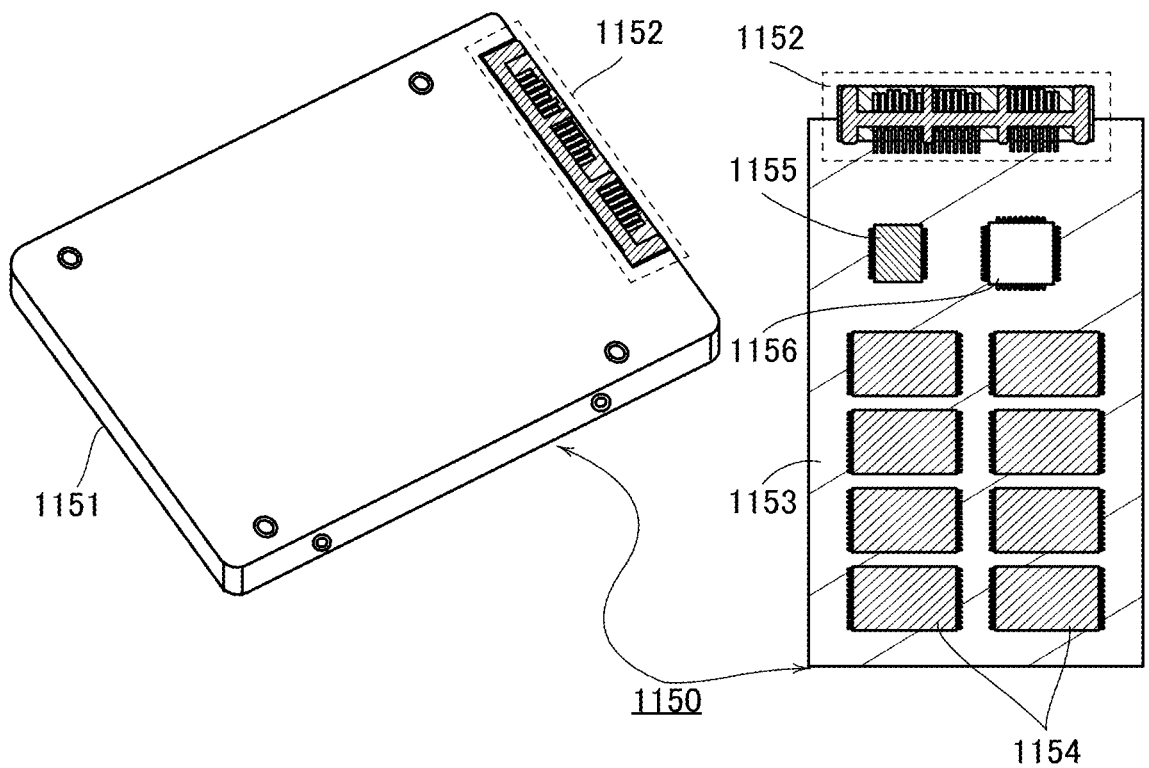

FIG. 19(D) is a schematic external view of an SSD, and FIG. 19(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments, the example, and the like.

Embodiment 6

The semiconductor device of one embodiment of the present invention can be used for a processor such as a CPU or a GPU or a chip. FIG. 20 illustrates specific examples of electronic devices including processors such as CPUs or GPUs, or chips of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer or the like, digital signage, and a large game machine like a pachinko machine. In addition, when the integrated circuit or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, a position, speed, acceleration, angular velocity, rotational frequency, distance, light, liquid, magnetism, temperature, a chemical substance, sound, time, hardness, an electric field, current, voltage, electric power, radioactive rays, a flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 20 illustrates examples of the electronic device.

[Mobile Phone]

FIG. 20(A) illustrates a mobile phone (smartphone) which is a type of information terminal. An information terminal

5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the chip of one embodiment of the present invention. Examples of the application utilizing artificial intelligence include an application for recognizing a conversation and displaying the contents of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal]

FIG. 20(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, although the smartphone and the desktop information terminal are respectively illustrated in FIGS. 20(A) and 20(B) as examples of the electronic device, one embodiment of the present invention can also be applied to an information terminal other than the smartphone and the desktop information terminal. Examples of an information terminal other than the smartphone and the desktop information terminal include a PDA (Personal Digital Assistant), a notebook information terminal, and a workstation.

[Electrical Appliance]

FIG. 20(C) illustrates an electric refrigerator-freezer 5800 which is an example of an electrical appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described as an electrical appliance in the example, other examples of the electrical appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 20(D) illustrates a portable game machine 5200 which is an example of a game machine. The portable game machine includes a housing 5201, a display portion 5202, a button 5203, and the like.

With the use of the GPU or the chip of one embodiment of the present invention in the portable game machine 5200, the portable game machine 5200 with low power consumption can be obtained. Furthermore, heat generation from a circuit can be reduced owing to low power consumption; thus, the influence of heat generation on the circuit itself, the peripheral circuit, and the module can be reduced.

Moreover, with the use of the GPU or the chip of one embodiment of the present invention in the portable game machine 5200, the portable game machine 5200 including artificial intelligence can be obtained.

Basically, the progress of a game, the actions and words of game characters, and expressions of a phenomenon or the like that occurs in the game are determined by a program of the game; however, the use of artificial intelligence in the portable game machine 5200 enables expressions not limited by the program of the game. For example, expressions are possible in which questions posed by the player, the progress of the game, time, and the actions and words of game characters are changed.

When a game requiring a plurality of players is played on the portable game machine 5200, the artificial intelligence can create a virtual game player; thus, the game can be played alone with the game player created by the artificial intelligence as an opponent.

Although the portable game machine is illustrated in FIG. 20(D) as an example of a game machine, the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), a throwing machine for batting practice installed in sports facilities, and the like.

[Moving Vehicle]

The GPU or the chip of one embodiment of the present invention can be used in an automobile, which is a moving vehicle, and around a driver's seat in the automobile.

FIG. 20(E1) illustrates an automobile 5700 which is an example of a moving vehicle, and FIG. 20(E2) illustrates the periphery of a windshield inside the automobile. FIG. 20(E2) illustrates a display panel 5701, a display panel 5702, and a display panel 5703 that are attached to a dashboard and a display panel 5704 that is attached to a pillar.

The display panel 5701 to the display panel 5703 can display a variety of kinds of information by displaying a speedometer, a tachometer, a mileage, a fuel meter, a gearshift indicator, air-condition setting, and the like. The content, layout, or the like of the display on the display panels can be changed appropriately to suit the user's preferences, so that the design can be improved. The display panel 5701 to the display panel 5703 can also be used as lighting devices.

The display panel 5704 displays an image taken by an imaging device (not illustrated) provided for the automobile 5700, whereby the view obstructed by the pillar (blind areas) can be complemented. That is, display of an image taken by an imaging device provided on the outside of the automobile 5700 can fill in blind areas and improve safety. In addition, display of an image that complements the area that cannot be seen makes it possible to confirm safety more naturally and comfortably. The display panel 5704 can also be used as a lighting device.

Because the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation, risk prediction, and the like.

Although an automobile is described above as an example of a moving vehicle, moving vehicles are not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

FIG. 20(F) schematically illustrates data transmission in a broadcasting system. Specifically, FIG. 20(F) illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although an UHF (Ultra High Frequency) antenna is illustrated as the antenna 5650 in FIG. 20(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 20(F) and may be satellite broadcasting using an artificial satellite, data broadcasting using an optical line, or the like.

The above-described broadcasting system may be a broadcasting system utilizing artificial intelligence by including the chip of one embodiment of the present invention. When the broadcast data is transmitted from the broadcast station 5680 to the TV 5600 of each household, the broadcast data is compressed by an encoder. The antenna 5650 receives the compressed broadcast data, and then the broadcast data is decompressed by a decoder of the receiving device in the TV 5600. Utilizing the artificial intelligence enables, for example, recognition of a display pattern included in a displayed image in motion compensation prediction, which is one of the compressing methods for the encoder. In addition, in-frame prediction or the like can also be performed utilizing the artificial intelligence. Furthermore, for example, when the broadcast data with low resolution is received and the broadcast data is displayed on the TV 5600 with high resolution, image interpolation processing such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

The electronic device and the functions of the electronic device, the application example of the artificial intelligence and its effects, and the like described in this embodiment can be combined as appropriate with the description of another electronic device.

This embodiment can be implemented in an appropriate combination with any of the structures described in the other embodiments, the example, and the like.

Example

In this example, the transistor 200 of one embodiment of the present invention (Sample 1B) was fabricated and the shape of Sample 1B was evaluated. Note that the shape of Sample 1B was evaluated using a scanning transmission electron microscope (STEM) and energy dispersive X-ray spectroscopy (EDX).

A fabrication method of Sample 1B will be described below. Note that the descriptions of FIG. 6 to FIG. 13 can be referred to for the details of the fabrication method of Sample 1B.

A tungsten film was used as the conductor 205. A silicon oxynitride film was used as the insulator 216. In addition, an aluminum oxide film and a silicon oxynitride film were used as the insulator 222 and the insulator 224, respectively, functioning as second gate insulators.

For a first oxide to be the oxide 230a, an In—Ga—Zn oxide was deposited by a sputtering method. The first oxide was deposited using an In—Ga—Zn oxide target with In:Ga:Zn=1:3:4 [atomic ratio]. Subsequently, for a second oxide to be the oxide 230b, an In—Ga—Zn oxide was deposited over the first oxide by a sputtering method. The second oxide was deposited using an In—Ga—Zn oxide target with In:Ga:Zn=4:2:4.1 [atomic ratio].

Next, heat treatment was performed. As the heat treatment, treatment was performed at 400° C. in an atmosphere containing nitrogen for one hour, and subsequently treatment was performed at 400° C. in an atmosphere containing oxygen for one hour.

Next, over the second oxide, a tantalum nitride film was deposited as a conductor to be the conductor 242. After that, the tantalum nitride film, the second oxide, and the first oxide were processed to form the conductive layer 242B, the oxide 230b, and the oxide 230a.

Next, an aluminum oxide film was deposited as the insulator 254 over the conductive layer 242B. A silicon oxynitride film was deposited as the insulator 280. Then, the silicon oxynitride film, the aluminum oxide film, and the conductive layer 242B were processed by a lithography method, so that the opening and the conductor 242 were formed.

Next, for the third oxide to be a lower layer of the oxide 230c, an In—Ga—Zn oxide was deposited in the opening by a sputtering method using an In—Ga—Zn oxide target with In:Ga:Zn=4:2:4.1 [atomic ratio]. Then, for the fourth oxide to be an upper layer of the oxide 230c, an In—Ga—Zn oxide was deposited by a sputtering method using an In—Ga—Zn oxide target with In:Ga:Zn=1:3:4 [atomic ratio].

Next, a silicon oxynitride film was deposited as the insulating film to be the insulator 250.

Next, as a conductive film to be the conductor 260a, a titanium nitride film was deposited over the insulating film to be the insulator 250. Then, a tungsten film was deposited as a conductive film to be the conductor 260b. Note that the titanium nitride film and the tungsten film were successively formed. After that, the tungsten film, the titanium nitride film, the insulating film to be the insulator 250, the fourth oxide, and the third oxide were processed to form the conductor 260b, the conductor 260a, the insulator 250, and the oxide 230c.

Next, an aluminum oxide film was deposited as the insulator 274 and then a silicon oxynitride film was deposited as the insulator 281.

Through the above steps, Sample 1B was fabricated.

<Cross-Sectional Observation and Elementary Analysis of Sample 1B>

Figure 21A:
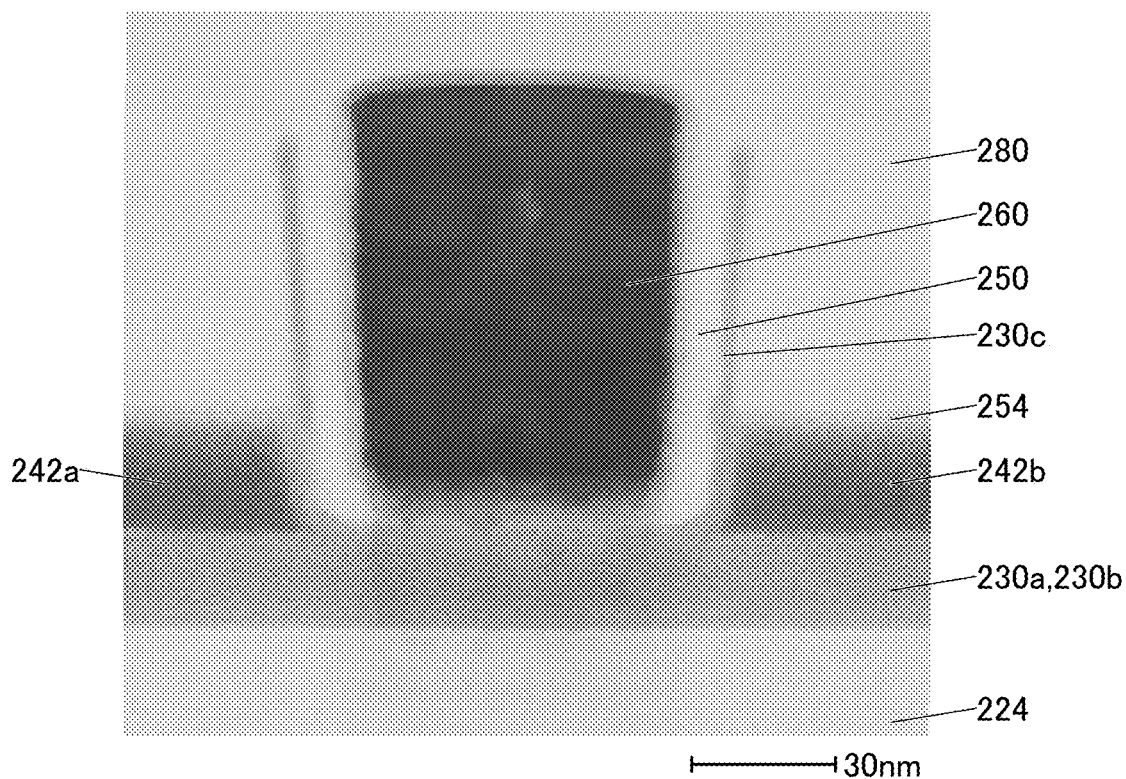
FIG. 21 (A), (B) A cross-sectional STEM image and an EDX map of an example of the present invention.
Figure 21B:
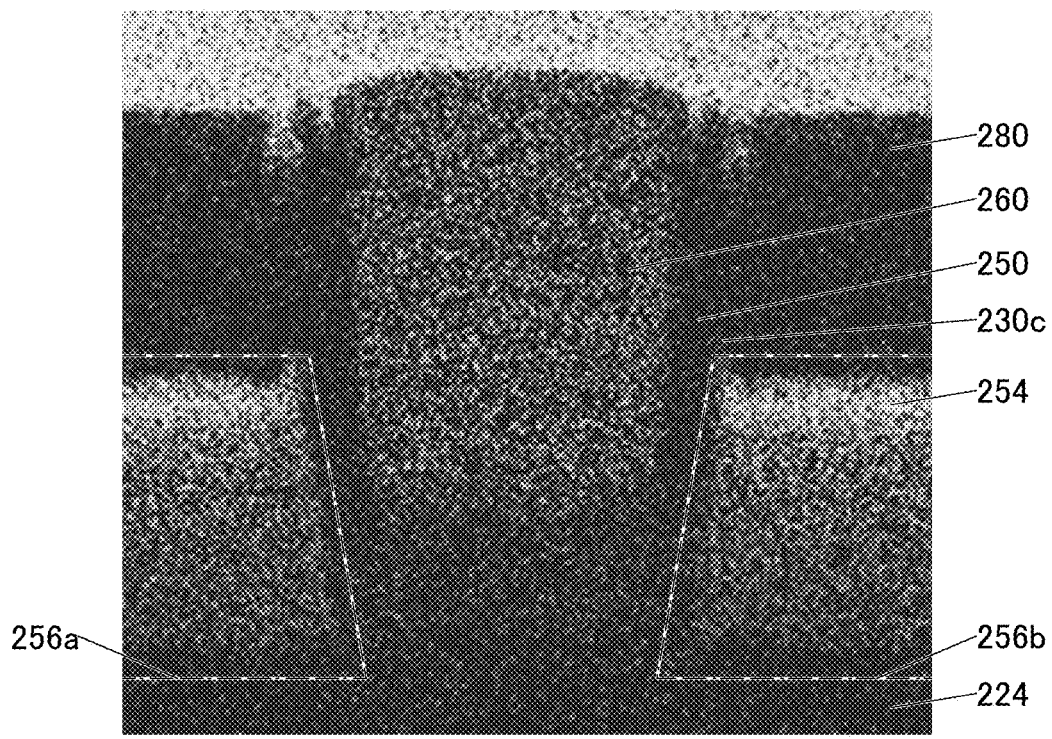

The results of cross-sectional observation and elementary analysis of Sample 1B are described. As an apparatus for cross-sectional observation and EDX measurement, HD-2300 manufactured by Hitachi High-Technologies Corporation was used. As an apparatus for elementary analysis, an EDX Si(Li) detector manufactured by EDAX Inc. was used. FIG. 21(A) is a cross-sectional STEM image of a portion of Sample 1B between dashed-dotted line L1-L2 and dashed-dotted line L3-L4 in FIG. 1. FIG. 21(B) is an EDX map of an Al—K line. Note that an EDX map of the same region as the region for the cross-sectional STEM image shown in FIG. 21(A) was obtained.

It is found from FIG. 21(A) and FIG. 21(B) that the opening formed in the insulator 280 and the like has a tapered shape. In addition, it is found that a plane parallel to the side end portion of the insulator 254 in the region 256a, which is in contact with the side surface of the conductor 242a, the side surface of the oxide 230b, and the side surface of the oxide 230a, is substantially aligned with the side surface of the conductor 242a, which faces the conductor 242b. It is also found that a plane parallel to the side end portion of the insulator 254 in the region 256b, which is in contact with the side surface of the conductor 242b, the side surface of the oxide 230b, and the side surface of the oxide 230a, is substantially aligned with the side surface of the conductor 242b, which faces the conductor 242a.

<Plan-View Observation and Elementary Analysis of Sample 1B>

Next, the results of plan-view observation and elementary analysis of Sample 1B are described. Note that Sample 1B was processed before plan-view observation and elementary analysis of Sample 1B were performed. Specifically, the top surface of Sample 1B was planarized until the top surfaces of the conductor 242a and the conductor 242b were exposed, and the bottom surface of Sample 1B was planarized until the conductor 205 was removed.

Figure 22A:
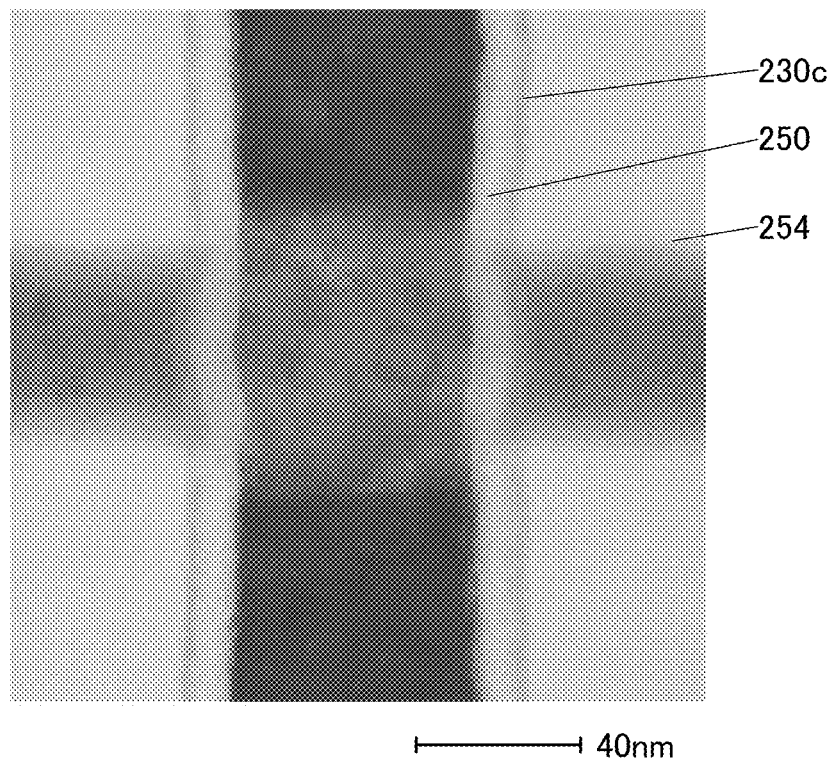
FIG. 22 (A), (B) A plan-view STEM image and an EDX map of an example of the present invention.
Figure 22B:
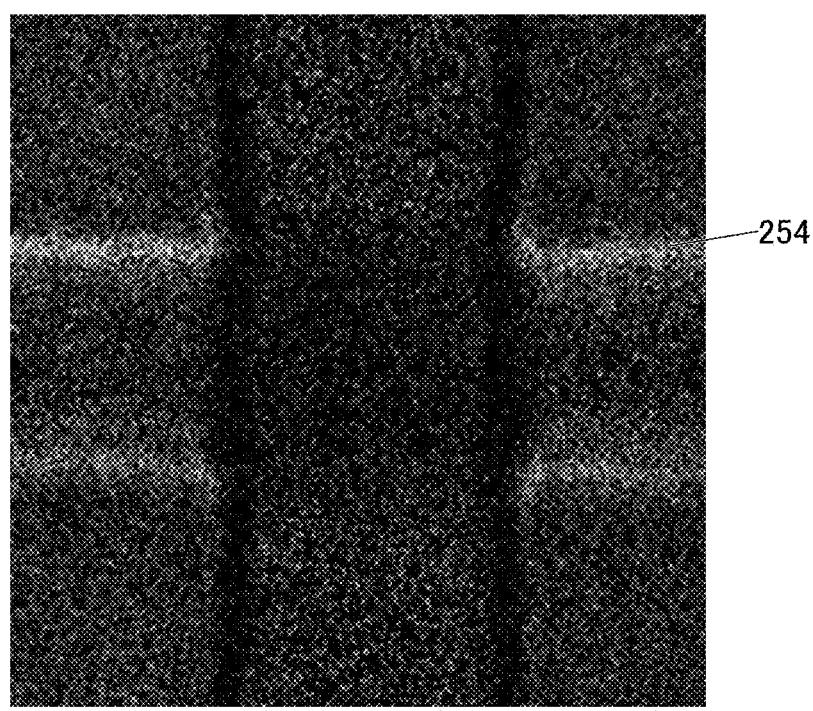

The plan-view observation and the elementary analysis were performed on Sample 1B after the above processing. As an apparatus for cross-sectional observation and EDX measurement, the above-mentioned apparatus was used. FIG. 22(A) is a plan-view STEM image of Sample 1B. FIG. 22(B) is an EDX map of an Al—K line. Note that an EDX map of the same region as the region for the plan-view STEM image was obtained.

It is found from FIG. 22(A) and FIG. 22(B) that a distance corresponding to the distance LE2 shown in FIG. 3 is shorter than a distance corresponding to the distance LE1 shown in FIG. 3. Furthermore, it is found that the facing side end portions of the insulator 254 each have a curved shape.

This example can be implemented in an appropriate combination with the structures described in the other embodiments.

REFERENCE NUMERALS

BGE: conductor, BGI1: insulator, BGI2: insulator, CAP: insulator, DE: conductor, LE1: length, LE2: length, LG1: length, LG2: length, SE: conductor, SEM1: semiconductor, SEM2: semiconductor, SEM3: semiconductor, TGE: conductor, TGI: insulator, 100: capacitor, 110: conductor, 112: conductor, 120: conductor, 130: insulator, 150: insulator, 200: transistor, 205: conductor, 210: insulator, 212: insulator, 214: insulator, 216: insulator, 218: conductor, 220: insulator, 222: insulator, 224: insulator, 230: oxide, 230a: oxide, 230A: oxide film, 230b: oxide, 230B: oxide film, 230c: oxide, 230C: oxide film, 231: region, 231a: region, 231b: region, 234: region, 239: region, 240: conductor, 240a: conductor, 240b: conductor, 241: insulator, 241a: insulator, 241b: insulator, 242: conductor, 242a: conductor, 242A: conductive film, 242b: conductor, 242B: conductive layer, 243: region, 243a: region, 243b: region, 244: angle, 244a: angle, 244b: angle, 246: conductor, 248: angle, 250: insulator, 250A: insulating film, 254: insulator, 254A: insulating film, 256a: region, 256b: region, 258: angle, 258a: angle, 258b: angle, 260: conductor, 260a: conductor, 260A: conductive film, 260B: conductive film, 260b: conductor, 274: insulator, 276: insulator, 280: insulator, 281: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 430c: oxide, 431a: oxide, 431b: oxide, 432a: oxide, 432b: oxide, 440: conductor, 440a: conductor, 440b: conductor, 442: conductor, 442a: conductor, 442b: conductor, 450: insulator, 460: conductor, 460a: conductor, 460b: conductor, 1001: wiring, 1002: wiring, 1003: wiring, 1004: wiring, 1005: wiring, 1006: wiring, 1007: wiring, 1008: wiring, 1009: wiring, 1010: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: memory device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5701: display panel, 5702: display panel, 5703: display panel, 5704: display panel, 5800: electric refrigerator-freezer, 5801: housing, 5802: refrigerator door, 5803: freezer door.

The invention claimed is:

1. A semiconductor device comprising a transistor,
wherein the transistor comprises a first insulator; a first oxide over the first insulator; a second oxide over the first oxide; a third oxide over the second oxide; a first conductor and a second conductor over the second oxide; a second insulator over the third oxide; a third conductor over the second insulator; a fourth insulator over the first conductor and the second conductor; and a third insulator over the fourth insulator, wherein an opening reaching the second oxide is provided in the third insulator and the fourth insulator, wherein the third oxide is positioned to cover an inner wall of the opening, wherein the second insulator is positioned to cover the inner wall of the opening with the third oxide therebetween, wherein the third conductor is positioned to fill the opening with the third oxide and the second insulator therebetween, wherein on the basis of a bottom surface of the first insulator, a level of a bottom surface of the third conductor in a region not overlapping with the second oxide is lower than a level of a bottom surface of the second oxide in a channel width direction of the transistor, and wherein a length of the bottom surface of the third conductor in the region not overlapping with the second oxide is shorter than a length of the bottom surface of the third conductor in a region overlapping with the second oxide in a channel length direction of the transistor.

2. The semiconductor device according to claim 1, wherein the fourth insulator comprises an oxide of aluminum.

3. The semiconductor device according to claim 1, wherein the second oxide comprises In, an element M, and Zn, and wherein the element M is Al, Ga, Y, or Sn.

4. A semiconductor device comprising a transistor, wherein the transistor comprises a first insulator; a first oxide over the first insulator; a second oxide over the first oxide; a third oxide over the second oxide; a first conductor and a second conductor over the second oxide; a second insulator over the third oxide; a third conductor over the second insulator; a fourth insulator over the first conductor and the second conductor; and a third insulator over the fourth insulator, wherein an opening reaching the second oxide is provided in the third insulator and the fourth insulator, wherein the third oxide is positioned to cover an inner wall of the opening, wherein the second insulator is positioned to cover the inner wall of the opening with the third oxide therebetween, wherein the third conductor is positioned to fill the opening with the third oxide and the second insulator therebetween, and wherein a side end portion of the fourth insulator has a curved shape when the transistor is seen from above.

5. The semiconductor device according to claim 4, wherein the fourth insulator comprises an oxide of aluminum.

6. The semiconductor device according to claim 4, wherein the second oxide comprises In, an element M, and Zn, and wherein the element M is Al, Ga, Y, or Sn.

* * * * *